United States Patent
Komatsu et al.

(10) Patent No.: US 8,125,845 B2
(45) Date of Patent: Feb. 28, 2012

(54) SEMICONDUCTOR INTEGRATED CIRCUIT DEVICE AND OPERATING METHOD THEREOF

(75) Inventors: Shigenobu Komatsu, Tachikawa (JP); Masanao Yamaoka, Kodaira (JP); Noriaki Maeda, Tachikawa (JP); Masao Morimoto, Koganei (JP); Yasuhisa Shimazaki, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 217 days.

(21) Appl. No.: 12/687,339

(22) Filed: Jan. 14, 2010

(65) Prior Publication Data
US 2010/0177580 A1    Jul. 15, 2010

(30) Foreign Application Priority Data
Jan. 15, 2009 (JP) .................................. 2009-006887

(51) Int. Cl.
*G11C 7/00* (2006.01)
(52) U.S. Cl. ...................... 365/203; 365/210.1; 365/214
(58) Field of Classification Search .................. 365/203, 365/210.1, 214
See application file for complete search history.

(56) References Cited

U.S. PATENT DOCUMENTS

| | | | |
|---|---|---|---|
| 6,947,315 B2 * | 9/2005 | Iwata | 365/158 |
| 7,656,732 B2 * | 2/2010 | Kuroda | 365/207 |
| 2003/0142540 A1 * | 7/2003 | Tanizaki et al. | 365/171 |
| 2010/0085799 A1 * | 4/2010 | Cho et al. | 365/148 |
| 2011/0080775 A1 * | 4/2011 | Bae et al. | 365/163 |

OTHER PUBLICATIONS

Arslan et al., "Variation-Tolerant SRAM Sense Amplifier Timing Using Configurable Replica Bitlines", IEEE Custom Integrated Circuits Conference (CICC), Sep. 2008, pp. 415-418.

Osada et al., "Universal-Vdd 0.65-2.0-V 32-kB Cache Using a Voltage-Adapted Timing-Generation Scheme and a Lithographically Symmetrical Cell", IEEE Journal of Solid-State Circuits, vol. 36, No. 11, Nov. 2001, pp. 1738-1744.

* cited by examiner

*Primary Examiner* — Tuan T. Nguyen
(74) *Attorney, Agent, or Firm* — Miles & Stockbridge P.C.

(57) ABSTRACT

Even when memory capacity of a memory that uses a replica bit-line is made higher, fluctuations of a generating timing of a sense-amplifier enable signal are reduced. A semiconductor integrated circuit device comprises a plurality of word lines, a plurality of bit-lines, a plurality of ordinary memory cells, an access control circuit, a plurality of sense-amplifiers, first and second replica bit-lines, first and second replica memory cells, and first and second logic circuits. The first and second replica memory cells are connected to the first and second replica bit-lines, respectively; inputs of the first and second logic circuits are connected to the first and second replica bit-lines, respectively; a sense-amplifier enable signal is generated from an output of the second logic circuit; and this signal is supplied to a plurality of sense-amplifiers.

16 Claims, 15 Drawing Sheets

SEMICONDUCTOR INTEGRATED CIRCUIT DEVICE AND OPERATING METHOD THEREOF

CROSS-REFERENCE TO RELATED APPLICATION

The present application claims priority from Japanese Patent Application No. JP 2009-006887 filed on Jan. 15, 2009, the content of which is hereby incorporated by reference into this application.

TECHNICAL FIELD OF THE INVENTION

The present invention relates to a semiconductor integrated circuit device and its operating method, and particularly relates to a technique useful for reducing fluctuations (changes or variations) of a generating timing of a sense-amplifier enable signal even when memory capacity of a built-in semiconductor memory using replica bit-lines (RBL) is made higher.

BACKGROUND OF THE INVENTION

To achieve high-speed, low-power read operations of Static Random Access Memories (SRAM) built in the semiconductor integrated circuit device, small-amplitude bit-lines (BL) and clocked sense-amplifiers are employed. For the reliable operation at high-speed, however, the sense-amplifier enable (SAE) signal must track delay fluctuations of global and local processes, voltage, and temperature (PVT) at the small-amplitude bit-lines (BL). If the sense-amplifier enable (SAE) signal is activated before a differential bit-line signal exceeds a sense-amplifier offset, a read failure may occur at a sense-amplifier output. Conversely, if the activation of the sense-amplifier enable (SAE) signal delays too far, then an access time and power consumption increase unnecessarily.

Umut Arslan et al, "Variation-Tolerant SRAM Sense-Amplifier Timing Using Configurable Replica bitlines", IEEE 2008 Custom Integrated Circuits Conference (CICC) 21-24 Sep. 2008, PP. 415-418 (Non-Patent Document 1) discloses that replica bit-lines (RBL) track delays of the bit-lines (BL) better than simple buffer chains regarding global (PVT) skews, and accordingly a self-timing of the sense-amplifier enable (SAE) signal is set using the replica bit-lines (RBL) in the SRAM. In the SRAM, replica word lines (RWL), replica memory cells, the replica bit-lines (RBL), dummy memory cells, and inverters are disposed between a word decoder and the sense-amplifiers. The replica word lines (RWL) generated from the word decoder in response to a clock signal by the read operations are asserted, whereby a plurality of replica memory cells are turned on so as to discharge the replica bit-lines (RBL) connected to the negative dummy memory cells. Full-amplitude replica bit-line (RBL) signals are inverted by the inverter and are buffered, whereby the generated sense-amplifier enable (SAE) signal is supplied to the sense-amplifiers. The replica bit-line (RBL) signal can be also used for both limiting a bit-line amplitude and deactivating the word lines for power saving. The read current of the memory cells on the same semiconductor die is correlated by global PVT fluctuations, whereby good tracking of the delays of the replica bit-lines (RBL) and the delays of the bit-lines (BL) is made possible.

SUMMARY OF THE INVENTION

The present inventors have engaged in research and development of a system LSI called a system-on-chip (SoC), which is built in a number of intellectual property (IP) cores and in various memories corresponding to a number of IP cores, prior to the present invention.

Miniaturization of the semiconductor manufacturing process leads to reduction in size of the memory cell, whereby a memory with higher capacity can be built in the SoC. Meanwhile, local delay fluctuations in the semiconductor manufacturing process increase for the miniaturization of the process. To track the delays of the bit-lines (BL) of the built-in SRAM due to such local delay fluctuations in the semiconductor manufacturing process, setting of the self-timing of the sense-amplifier enable (SAE) signal using the replica bit-lines (RBL) disclosed in Non-Patent Document 1 is an effective technique.

FIG. 1 is a view showing a configuration of the SRAM that uses the replica bit-lines (RBL) studied by the present inventors based on the technique disclosed in Non-Patent Document 1 prior to the present invention.

The SRAM shown in FIG. 1 includes a word driver (WD), a decode control circuit (CTRL), a replica word line (rplwl), a plurality (the number of j, j>1) of replica memory cells (RPLCELL), a replica bit-line (rplbl), a plurality (the number of k, k>1) of dummy memory cells (DMYCELL), a pre-charge transistor (PCH), an inverter (INV), and a buffer (BUF). Moreover, the SRAM shown in FIG. 1 includes a plurality (n+1>1) of word lines (wl[0] to [n]), a plurality (m+1>1) of bit-line/inverted-bit-line pairs (bt[0], bb[0] to bt[m], bb[m]), a plurality ((n+1)×(m+1)) of SRAMs/memory-cells (MEMCELL), and a plurality (m+1>1) of sense-amplifiers (SA).

A clock CLK and address signals [0] to [h] are supplied to the decode control circuit CTRL, whereby decoder signals dec[0] to [i] are supplied to the word driver WD from the decode control circuit CTRL, and replica word line (rplwl) signals are supplied to the pre-charge transistor PCH and the plurality (the number of j) of replica memory cells RPLCELL from the decode control circuit CTRL. A source of a P-channel MOS transistor P0 as the pre-charge transistor PCH is connected to a power supply voltage $V_{DD}$ while a drain of the transistor P0 is connected to the replica bit-line rplbt. This replica bit-line rplbt is connected to the plurality (the number of k, k>1) of dummy memory cells DMYCELL, the plurality (the number of j, j>1) of replica memory cells RPLCELL, and an input terminal of the inverter INV. The inverted replica bit-line rplbtn generated from an output terminal of the inverter INV is supplied to the decode control circuit CTRL and an input terminal of the buffer BUF, and a sense-amplifier enable signal sae is generated from an output terminal of the buffer BUF and is supplied to a plurality (m+1>1) of sense-amplifiers SA. When SRAM cell read signals from the plurality (m+1>1) of bit-line/inverted-bit-line pairs (bt[0], bb[0] to bt[m], bb[m]) are supplied to differential input terminals of the plurality of sense-amplifiers SA, read data q[0] to [m] are generated from output terminals of the plurality of sense-amplifiers SA.

FIG. 2 is a waveform chart of each section of the SRAM shown in FIG. 1 for describing an operation of the SRAM shown in FIG. 1.

As shown in FIG. 2, one signal selected from the decoder signals dec[0] to [i] falls in response to the address signals [0] to [h] which vary in synchronization with rising of the clock signal CLK. One word line corresponding to the address signal is selected from among the word lines wl[0] to [n], and rises. Electric charges of one of each bit-line/inverted-bit-line pair among the plurality (m+1>1) of bit-line/inverted-bit-line pairs bt[0], bb[0] to bt[m], and bb[m] begin to be extracted in response to a memory holding state of the memory cell having the plurality (m+1) of bits, which is connected to the rising and selected word line. Note that when the replica word line rplwl is at a low-level, the replica bit-line rplbt is pre-charged to the power supply voltage $V_{DD}$ of a high-level by the P-channel MOS transistor P0 serving as the pre-charge transistor PCH.

Meanwhile, a potential of the replica word line rplwl rises to a high-level in response to the rising of the clock signal CLK. Inside the plurality (the number of j) of replica memory cells RPLCELL, the power supply voltage $V_{DD}$ of a high-level is supplied to an input terminal of a CMOS inverter constituted by a P-channel MOS transistor P11 and an N-channel MOS transistor N11, so that an output terminal of this CMOS inverter is maintained at a ground potential GND. When the potential of the replica word line rplwl is raised to a high-level, since N-channel MOS transistors N12 serving as transfer transistors within the plurality (the number of j) of replica memory cells RPLCELL are turned on, the pre-charged electric charges of the replica bit-line rplbt is discharged to the ground potential GND via the plurality (the number of j) of transfer transistors N12 within the plurality (the number of j) of replica memory cells RPLCELL. When the potential of the replica bit-line rplbt is lowered to a level which is lower than that of a logic threshold of the inverter INV by this discharge, an output of the inverter INV becomes a high-level, and a potential of an inverted replica bit-line rplbtn rises. A signal of the inverted replica bit-line rplbtn is supplied to an input terminal of the buffer BUF, and the sense-amplifier enable signal sae generated from an output terminal of the buffer BUF is supplied to the plurality (m+1>1) of sense-amplifiers SA. A potential difference $\Delta V$ among the plurality (m+1>1) of bit-line/inverted-bit-line pairs (bt[0], bb[0] to bt[m], and bb[m]) at the rising timing of the sense-amplifier enable signal sae is amplified by the plurality (m+1>1) of sense-amplifiers SA, whereby read data q[0] to [m] are outputted. When this potential difference $\Delta V$ of the bit-line/inverted-bit-line pair is smaller than an offset portion of the inputted potential difference of the sense-amplifier SA, reading of the data results in failure. A timing adjustment is executed so that a timing where the potential of any selected word line from among the word lines wl[0] to [n] rises and where the potential difference $\Delta V$ among the plurality (m+1>1) of bit-lines/inverted-bit-lines becomes larger than the offset portion of the inputted potential difference of the sense-amplifier SA are nearly simultaneously with a timing where the replica word line rplwl rises and where the replica bit-line rplbl falls and where the sense-amplifier enable signal sae rises. The adjustment of the rising timing of the potential of the sense-amplifier enable signal sae can be executed by the adjustment of the number (the number of j) of replica memory cells RPLCELL which are connected to the replica bit-line rplbt. That is, by the increase and decrease of the number (the number of j) of replica memory cells RPLCELL, discharge speed of the pre-charged electric charges of the replica bit-line rplbt to the ground potential GND is increased and decreased, whereby the rising timing of the potential of the sense-amplifier enable signal sae can be adjusted.

As described above, by adopting the technique of setting the self-timing of the sense-amplifier enable signal using the replica bit-lines (RBL) disclosed in Non-Patent Document 1, the tracking of the delays of the bit-lines (BL) of the built-in SRAM due to the local delay fluctuations of the semiconductor manufacturing process can be realized.

However, it has become apparent that the setting technique of the self-timing of the sense-amplifier enable signal in the SRAM which uses the replica bit-lines studied by the present inventors prior to the present invention based on the technique disclosed in Non-Patent Document 1 described in FIGS. 1 and 2 has the following problem.

The problem arises when a delay of the replica bit-line rplbt becomes large by an increase of the number of words as the memory capacity of the built-in memory stored in the SoC is made higher. That is, when the delay of the replica bit-line rplbt becomes large by the increase of the number of words as the memory capacity is made higher, the delay fluctuations of the replica bit-line rplbt are increased by the fluctuations of the cell current due to the local fluctuations of the plurality (the number of j) of replica memory cells RPLCELL, each of which discharges the pre-charged electric charges of the replica bit-line rplbt to the ground potential GND. Moreover, local fluctuations of the logic threshold of the inverter INV, to which the signal of the replica bit-line rplbt is supplied, are increased as the memory capacity is made higher. As a result, the problem that the fluctuations of a generating timing (rising timing) of the sense-amplifier enable signal sae are increased by the delay fluctuations of the replica bit-line rplbt and the local fluctuations of the logic threshold of the inverter INV has become apparent. These fluctuations have become a cause of a failure in reading data from the output terminal of the sense-amplifier SA.

FIG. 17 is a view showing a fluctuation state of the generating timing (rising timing) of the sense-amplifier enable signal sae, by the delay fluctuations of the replica bit-line rplbt of the SRAM that uses the replica bit-lines studied by the present inventors prior to the present invention described in FIGS. 1 and 2 and by the local fluctuations of the logic threshold of the inverter INV.

In an example of FIG. 17, the number of word lines (wl[0] to [n]) of the SRAM is 1024, and the signal of the replica bit-line rplbt generates a transient-amplitude of approximately 1 V at an elapsing time of t_sae. Even in this transient-amplitude of the replica bit-line rplbt, there is the case where the delay of the replica bit-line rplbt is small (high-speed transient-amplitude characteristic, i.e., characteristic of late potential transition of signals) and has a high-speed transient-amplitude characteristic rplbt_ft, or the case where the delay of the replica bit-line rplbt is large (low-speed transient-amplitude characteristic, i.e., characteristic of fast potential transition of signals) and has a low-speed transient-amplitude characteristic rplbt_sl. Meanwhile, there are the case where the logic threshold of the inverter INV, to which the signal of the replica bit-line rplbt is supplied, has a high logic threshold voltage $V_L\text{th\_high}$, and the case where the logic threshold of the inverter INV, to which the signal of the replica bit-line rplbt is supplied, has a low logic threshold voltage $V_L\text{th\_low}$. Therefore, the generating timing of the small delay sae_ft of the sense-amplifier enable signal sae is determined by a crossover of the high-speed transient-amplitude characteristic rplbt_ft and the low logic threshold voltage $V_L\text{th\_low}$. Moreover, the generating timing of the large delay sae_sl of the sense-amplifier enable signal sae is determined by a crossover of the low-speed transient-amplitude characteristic rplbt_sl and the high logic threshold voltage $V_L\text{th\_high}$. As a result, it has been found that a fluctuation width $\Delta t\_sae$ of the generating timing of the sense-amplifier enable signal sae is enlarged up to 8% of the whole.

As described above, the present invention is made as a result of the study by the present inventors prior to the present invention.

Therefore, an object of the present invention is to reduce the fluctuations of the generating timing of the sense-amplifier enable signal even when the memory capacity of the semiconductor memory that uses the replica bit-lines (RBL) built in the semiconductor integrated circuit device is made higher.

The above and other objects and novel features of the present invention will become apparent from this specification and the accompanying drawings.

Typical ones of the inventions disclosed in the present application will be briefly described as follows.

That is, a semiconductor integrated circuit device according to a typical embodiment of the present invention includes: a plurality of word lines (wl[0] to wl[n]); a plurality of bit-lines (bt[0], bb[0] to bt[m], bb[m]); a plurality of ordinary memory cells (MEMCELL); an access control circuit (WD, CTRL); a plurality of sense-amplifiers (SA); a first replica bit-line (rplbt[0]); a second replica bit-line (rplbt[1]); a first replica memory cell (RPLCELL); a second replica memory cell (RPLCELL); a first logic circuit (INV0); and a second logic circuit (INV1).

The first replica memory cell is connected to the first replica bit-line, and the second replica memory cell is connected to the second replica bit-line. An input terminal of the first logic circuit is connected to the first replica bit-line, and an output terminal of the first logic circuit is connected to the second replica bit-line. An input terminal of the second logic circuit is connected to the second replica bit-line, and a sense-amplifier enable signal (sae) is generated from an output terminal of the second logic circuit (see FIG. 3).

The above typical embodiment has the feature that by the sense-amplifier enable signal (sae) being supplied to the plurality of sense-amplifiers (SA), a plurality of read signals of the plurality of bit-lines are amplified by the plurality of sense-amplifiers, and a plurality of pieces of read data (q[0] to q[m]) are generated from a plurality of output terminals of the sense-amplifiers (see FIG. 4).

Effects obtained by typical one of the inventions disclosed in the present application will be briefly described as follows. That is, the fluctuations of the generating timing of the sense-amplifier enable signal can be reduced even if the memory capacity of the semiconductor memory that uses the replica bit-lines (RBL) is made higher.

DESCRIPTION OF THE PREFERRED EMBODIMENTS

Typical Embodiment

Figure 1:
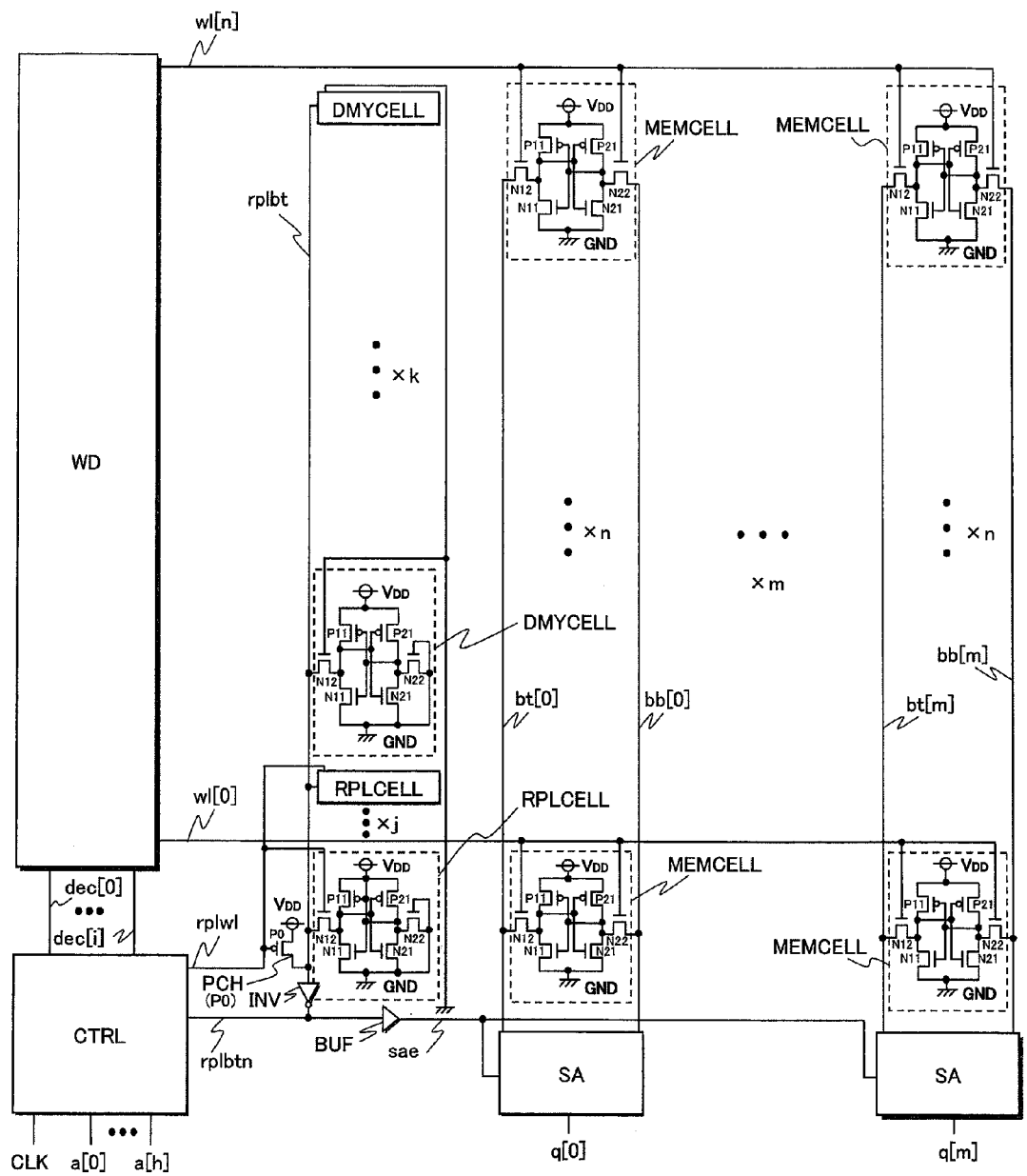
FIG. 1 is a view showing a configuration of a SRAM that uses replica bit-lines studied by the present inventors based on a technique disclosed in Non-Patent Document 1 prior to the present invention.
Figure 2:
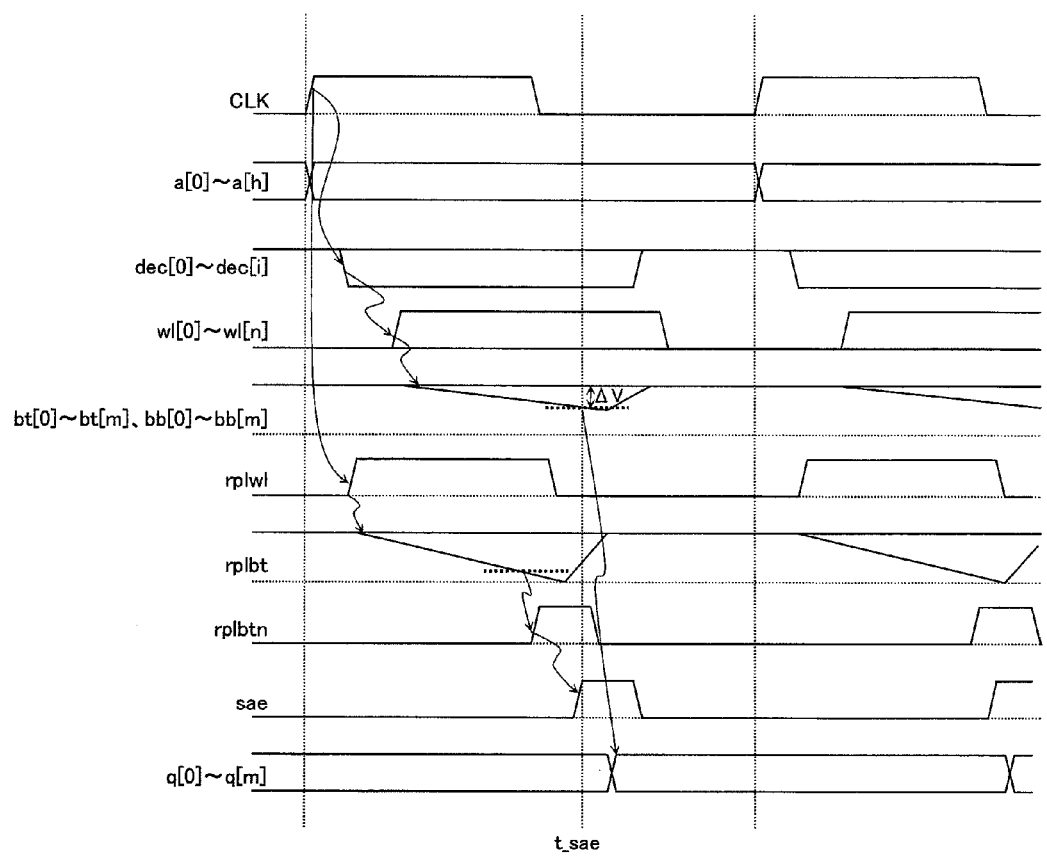
FIG. 2 is a waveform chart of each section of the SRAM shown in FIG. 1 for describing an operation of the SRAM illustrated in FIG. 1.

First, outline of a typical embodiment of the invention disclosed in the present application will be described. Reference symbols in the drawings, which are enclosed within parentheses and are referred to in the outline of the typical embodiment, merely exemplifies ones included in concepts of constituent elements represented by the parentheses.

[1] A typical embodiment of the present invention is a semiconductor integrated circuit device comprises:
  a plurality of word lines (wl[0] to wl[n]) disposed approximately in parallel to a column direction;
  a plurality of bit-lines (bt[0], bb[0] to bt[m], bb[m]) disposed approximately in parallel to a row direction;
  a plurality of ordinary memory cells (MEMCELL) connected to the plurality of word lines and the plurality of bit-lines;
  an access control circuit (WD, CTRL) capable of selecting arbitrarily one from among the plurality of word lines in response to address signals (a[0] to a[h]); and
  a plurality of sense-amplifiers (SA) connected to the plurality of bit-lines.

The semiconductor integrated circuit device further comprises a first replica bit-line (rplbt[0]); a second replica bit-line (rplbt[1]); a first replica memory cell (RPLCELL); a second replica memory cell (RPLCELL); a first logic circuit (INV0); and a second logic circuit (INV1).

The first replica memory cell is connected to the first replica bit-line, and the second replica memory cell is connected to the second replica bit-line.

An input terminal of the first logic circuit is connected to the first replica bit-line, and an output terminal of the first logic circuit is connected to the second replica bit-line.

Figure 3:
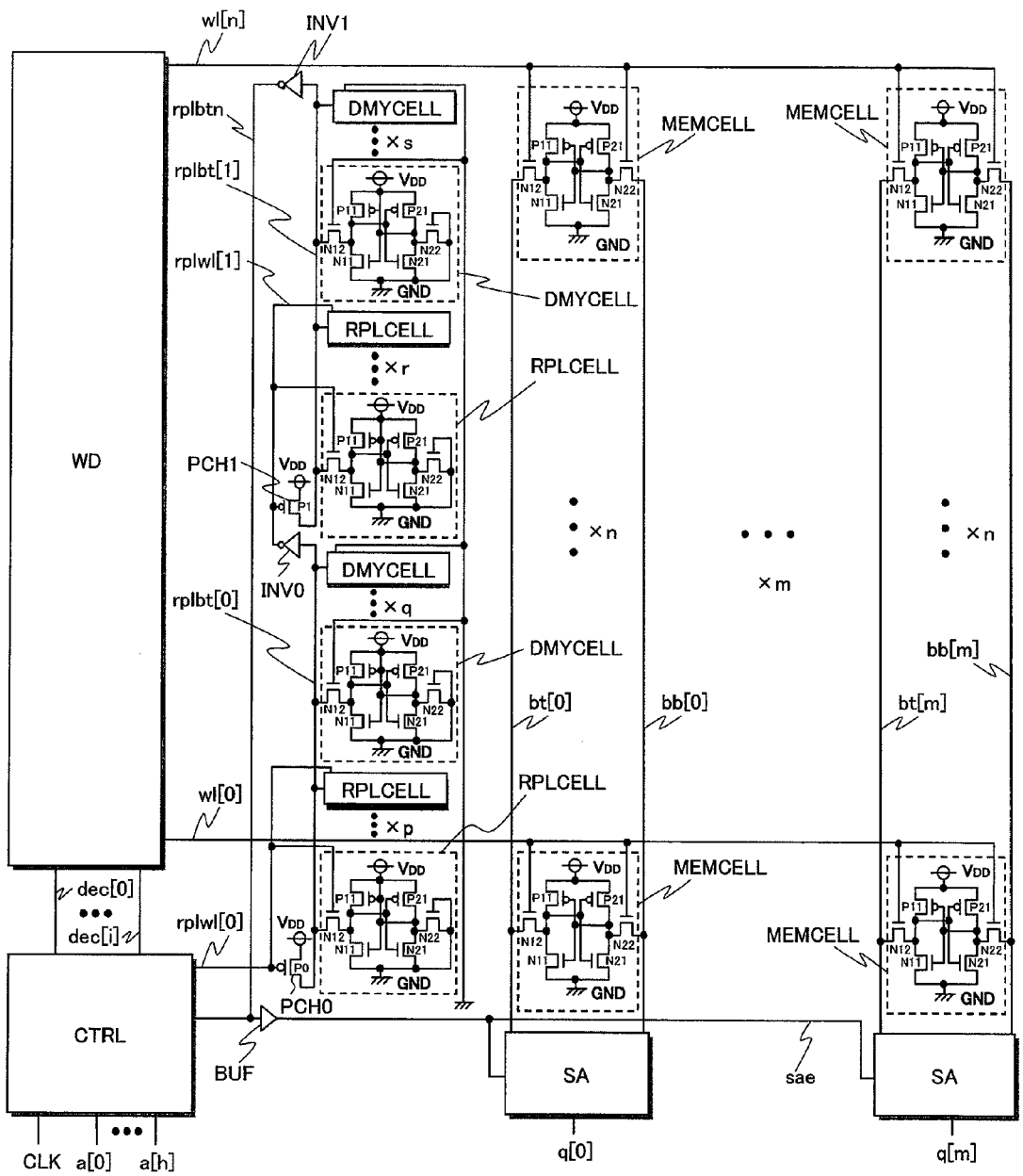
FIG. 3 is a view showing a configuration of a SRAM that uses replica bit-lines according to a first embodiment of the present invention.

An input terminal of the second logic circuit is connected to the second replica bit-line, and a sense-amplifier enable signal (sae) is generated from an output terminal of the second logic circuit (see FIG. 3).

Figure 4:
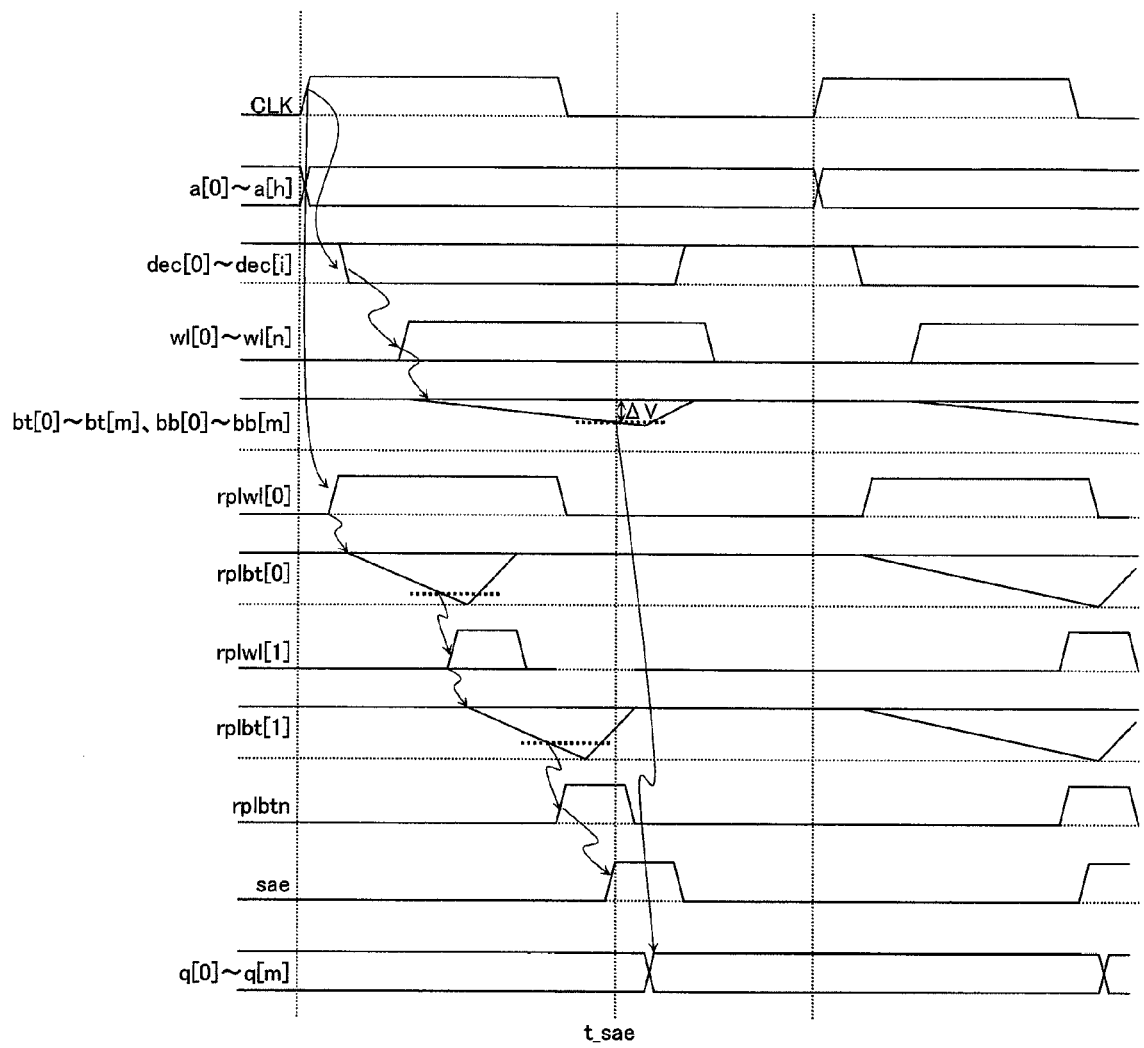
FIG. 4 is a waveform chart of each section of the SRAM shown in FIG. 3 for describing an operation of the SRAM according to the first embodiment of the present invention illustrated in FIG. 3.

The typical embodiment has the feature that by the sense-amplifier enable signal (sae) being supplied to the plurality of sense-amplifiers (SA), a plurality of read signals of the plurality of bit-lines are amplified by the plurality of sense-amplifiers, and a plurality of pieces of read data (q[0] to q[m]) are generated from a plurality of output terminals of the sense-amplifiers (see FIG. 4).

According to the above embodiment, since the replica bit-line is divided into the plurality of replica bit-lines, a delay amount of each divided replica bit-line is reduced. By reduction of the delay amount of each divided replica bit-line, delay fluctuations of each divided replica bit-line are reduced. Therefore, fluctuations of a generating timing of the sense-amplifier enable signal (sae) due to the reduced delay fluctuations of each replica bit-line and due to local fluctuations of the logic thresholds of the first and second logic circuits (INV0, INV1) can be reduced (see FIG. 18).

A semiconductor integrated circuit device according to a preferred embodiment further comprises a first pre-charge transistor (PCH0) and a second pre-charge transistor (PCH1).

The first pre-charge transistor is connected to the first replica bit-line (rplbt[0]), and the second pre-charge transistor is connected to the second replica bit-line (rplbt[1]).

The above-mentioned semiconductor integrated circuit device has the feature that the first pre-charge transistor and the second pre-charge transistor set the first replica bit-line and the second replica bit-line to predetermined pre-charge potentials ($V_{DD}$), respectively, before a plurality of pieces of read data are generated from the plurality of output terminals of the plurality of sense-amplifiers in response to the sense-amplifier enable signal (see FIG. 4).

A semiconductor integrated circuit device according to another preferred embodiment further comprises a first dummy memory cell (DMYCELL) and a second dummy memory cell (DMYCELL).

The above-mentioned semiconductor integrated circuit device has the feature that the first dummy memory cell is connected to the first replica bit-line (rplbt[0]), and the second dummy memory cell is connected to the second replica bit-line (rplbt[1]) (see FIG. 3).

A semiconductor integrated circuit device according to still another preferred embodiment is such that a word driver (WD) included in the access control circuit comprises a plurality of CMOS word drivers, . . . , (K−1, CMOS_Drv), (K, CMOS_Drv), (K+1, CMOS_Drv), (K+2, CMOS_Drv), . . . .

The CMOS word drivers are disposed in the row direction, and two CMOS word drivers (K, CMOS_Drv) and (K+1, CMOS_Drv) that are close to each other in the plurality of CMOS word drivers include intermediate regions (611, 612, 613, 621, 622) therebetween. The above-mentioned semiconductor integrated circuit device has the feature that the first pre-charge transistor (PCH0) and the first logic circuit (INV0) are formed within the intermediate region (see FIGS. 5 and 6).

Figure 7:
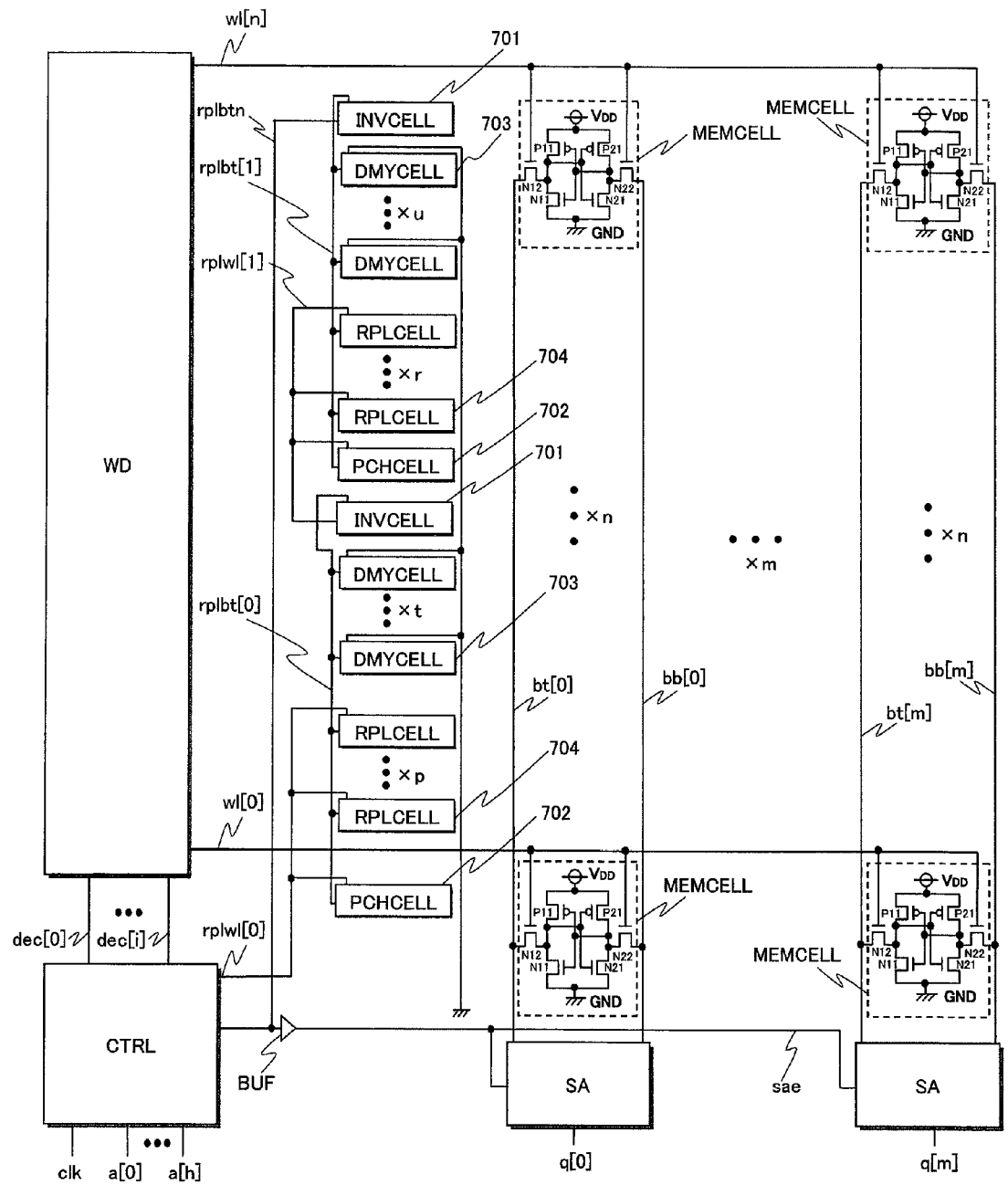
FIG. 7 is a view showing a configuration of a SRAM according to a third embodiment of the present invention.
Figure 8:
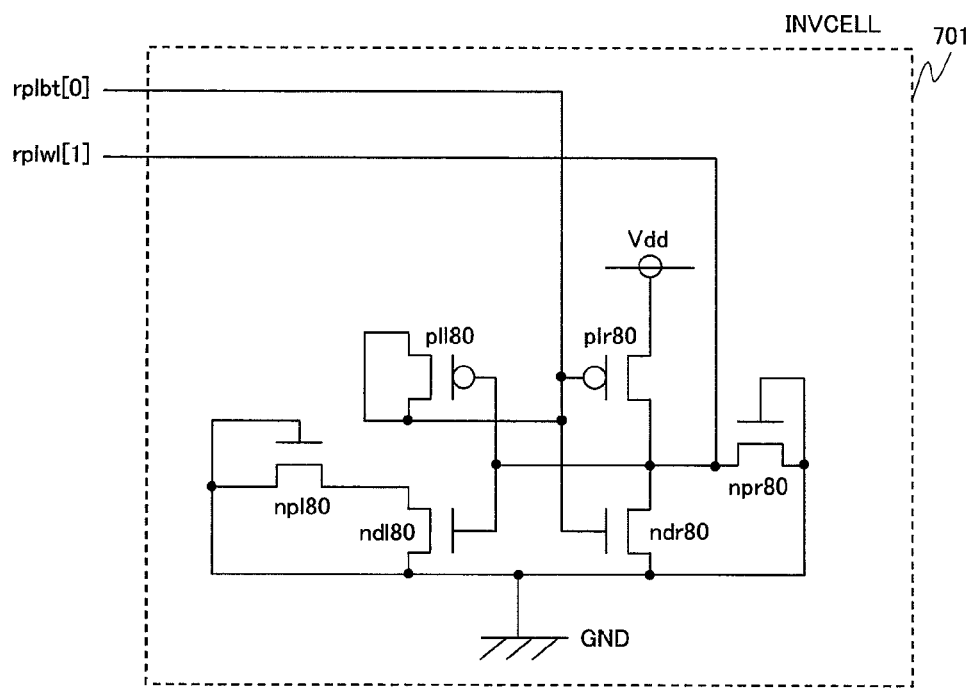
FIG. 8 is a view showing a configuration of an inverter cell of the SRAM according to the third embodiment of the present invention illustrated in FIG. 7.
Figure 9:
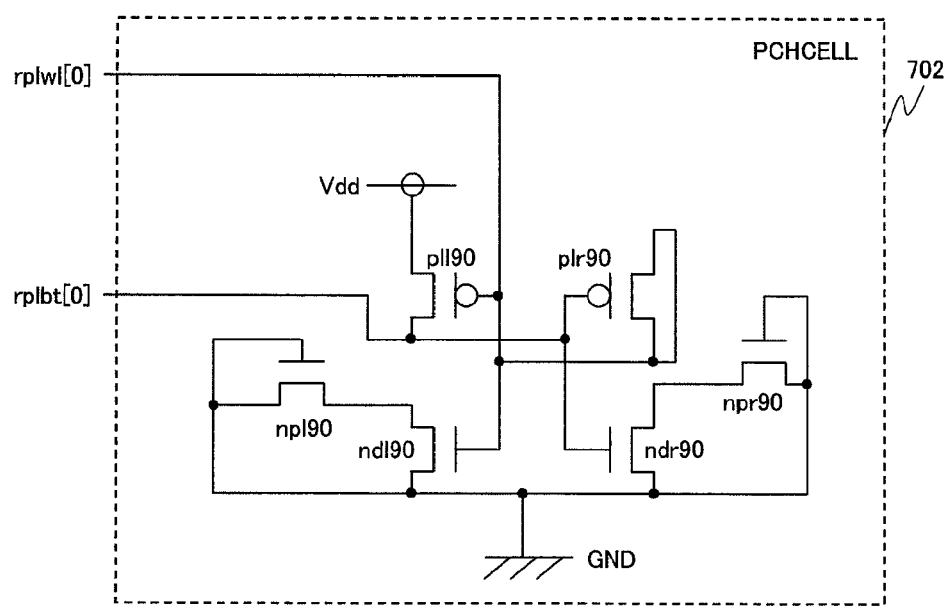
FIG. 9 is a view showing a configuration of a pre-charge cell of the SRAM according to the third embodiment of the present invention illustrated in FIG. 7.

A semiconductor integrated circuit device according to a more preferred embodiment has the feature that the first logic circuit (701) is formed by the first CMOS memory cell (INVCELL), and the first pre-charge transistor (702) is formed by the second CMOS memory cell (PCHCELL) (see FIGS. 7, 8, and 9).

A semiconductor integrated circuit device according to a still more preferred embodiment has the feature that the first CMOS memory cell forming the first logic circuit, and the second CMOS memory cell forming the first pre-charge transistor are formed between the first dummy memory cell (DMYCELL) connected to the first replica bit-line (rplbt[0]) and the second replica memory cell (RPLCELL) connected to the second replica bit-line (rplbt[1]) (see FIG. 7).

A semiconductor integrated circuit device (1) according to one specific embodiment has the feature that the first dummy memory cell (703) connected to the first replica bit-line (rplbt[0]) is formed by a third CMOS memory cell (DMYCELL), and the second dummy memory cell (703) connected to the second replica bit-line (rplbt[1]) is formed by a fourth CMOS memory cell (DMYCELL) (see FIGS. 7, 10 to 14).

A more specific embodiment has the feature that the plurality of ordinary memory cells (MEMCELL) are SRAM memory cells (FIG. 3).

[2] A typical embodiment from the different viewpoint of the present invention is an operating method of a semiconductor integrated circuit device comprising:

a plurality of word lines (wl[0] to wl[n]) disposed approximately in parallel to a column direction;
  a plurality of bit-lines (bt[0], bb[0] to bt[m], bb[m]) disposed approximately in parallel to a row direction;
  a plurality of ordinary memory cells (MEMCELL) connected to the plurality of word lines and the plurality of bit-lines;
  an access control circuit (WD, CTRL) capable of selecting arbitrarily one from among the plurality of word lines in response to address signals (a[0] to a[h]); and
  a plurality of sense-amplifiers (SA) connected to the plurality of bit-lines.

The semiconductor integrated circuit device further comprises: a first replica bit-line (rplbt[0]); a second replica bit-line (rplbt[1]); a first replica memory cell (PRLCELL); a second replica memory cell (RPLCELL); a first logic circuit (INV0); and a second logic circuit (INV1).

The first replica memory cell is connected to the first replica bit-line, and the second replica memory cell is connected to the second replica bit-line.

An input terminal of the first logic circuit is connected to the first replica bit-line, and an output terminal of the first logic circuit is connected to the second replica bit-line.

An input terminal of the second logic circuit is connected to the second replica bit-line, and a sense-amplifier enable signal (sae) is generated from an output terminal of the second logic circuit (see FIG. 3).

The above-mentioned semiconductor integrated circuit device has the feature that by the sense-amplifier enable signal (sae) being supplied to the plurality of sense-amplifiers (SA), a plurality of read signals of the plurality of bit-lines are amplified by the plurality of sense-amplifiers, and a plurality of pieces of read data (q[0] to q[m]) are generated from a plurality of output terminals of the plurality of sense-amplifiers (see FIG. 4).

DESCRIPTION OF EMBODIMENTS

Next, embodiments will be further described in detail. Note that in all the drawings for describing preferred embodiments of the invention, component elements having the same functions are denoted by the same reference numerals, and its repetitive description will be omitted.

First Embodiment

Configuration of SRAM

FIG. 3 is a view showing a configuration of a SRAM that uses replica bit-lines according to a first embodiment of the present invention.

The SRAM shown in FIG. 3 is basically different from the SRAM shown in FIG. 1 in that one replica bit-line rplbt of the SRAM shown in FIG. 1 is divided into a plurality of replica bit-lines rplbt[0] and rplbt[1] as shown in the SRAM of FIG. 3, whereby delay amounts at the replica bit-lines are reduced.

Similarly to the SRAM shown in FIG. 1, the SRAM shown in FIG. 3 also includes: a word driver (WD); a decode control circuit (CTRL); a plurality (n+1>1) of word lines (wl[0] to [n]); a plurality (m+1>1) of bit-line/inverted-bit-line pairs (bt[0], bb[0] to bt[m], bb[m]); a plurality ((n+1)×(m+1)) of SRAM memory cells (MEMCELKL); and a plurality (m+1>1) of sense-amplifiers (SA).

The SRAM shown in FIG. 3 is different from the SRAM shown in FIG. 1 in that the SRAM shown in FIG. 3 includes: a first replica word line (rplwl[0]) and a second replica word line (rplwl[1]); a first replica bit-line (rplbt[0]) and a second replica bit-line (rplbt[1]); a first pre-charge transistor PCH0 (P-channel MOS transistor P0) and a second pre-charge transistor PCH1 (P-channel MOS transistor P1); a first inverter (INV0) and a second inverter (INV1); a first replica memory cell (RPLCELL) and a second replica memory cell (PRPLCELL); and a first dummy memory cell (DMYCELL) and a second dummy memory cell (DMYCELL).

A clock CLK and address signals [0] to [h] are supplied to the decode control circuit CTRL, whereby decoder signals dec[0] to [i] are supplied to the word driver WD from the decode control circuit CTRL, and the first replica word line signal rplwl[0] is supplied to the first pre-charge transistor PCH0 and the plurality (the number of p, p>1) of first replica memory cells RPLCELL from the decode control circuit CTRL. A source of the P-channel MOS transistor P0 serving as the first pre-charge transistor PCH0 is connected to a power supply voltage $V_{DD}$ while a drain of the transistor P0 is connected to the first replica bit-line rplbt[0]. This first replica bit-line rplbt[0] is connected to the plurality (the number of p, p>1) of first replica memory cells RPLCELL, the plurality (the number of q, q>1) of first dummy memory cells DMYCELL, and an input terminal of the first inverter INV0. The second replica word line signal rplwl[1] generated from an output terminal of the first inverter INV0 is supplied to the second precharge transistor PCH1 and the plurality (the number of r, r>1) of second replica memory cells RPLCELL. A source of a P-channel MOS transistor P1 serving as the second precharge transistor PCH1 is connected to the power supply voltage $V_{DD}$ while a drain of the transistor P1 is connected to the second replica bit-line rplbt[1]. This second replica bit-line rplbt[1] is connected to the plurality (the number of r, r>1) of second replica memory cells RPLCELL, the plurality (the number of s, s>1) of second dummy memory cells DMYCELL, and an input terminal of the second inverter INV1. An inverted replica bit-line rplbtn generated from an output terminal of this second inverter INV1 is supplied to the decode control circuit CTRL and an input terminal of a buffer BUF, and a sense-amplifier enable signal sae is generated from an output terminal of the buffer BUF and supplied to a plurality (m+1>1) of sense-amplifiers SA. A SRAM cell reading signal from the plurality (m+1>1) of bit-line/inverted-bit-line pairs bt[0], bb[0] to bt[In], bb[m] is supplied to differential input terminals of the plurality of sense-amplifiers SA, whereby read data q[0] to [m] are generated from output terminals of the plurality of sense-amplifiers SA.

<<Operation of SRAM>>

FIG. 4 is a waveform chart of each section of a SRAM shown in FIG. 3 for describing an operation of a SRAM according to a first embodiment shown in FIG. 3.

As shown in FIG. 4, one signal selected from the decoder signals dec[0] to [i] falls in response to the address signals [0] to [h] which vary in synchronization with the rising of the clock signal CLK. One word line corresponding to the address signal is selected from among the word lines wl[0] to [n], and rises. The electric charges of the bit-line that is one of each bit-line/inverted-bit-line pair among the plurality (m+1>1) of bit-line/inverted-bit-line pairs bt[0], bb[0] to bt[m], bb[m] begin to be drawn out in response to a memory holding state of the memory cell having a plurality (m+1) of bits to which the rising and selected word line is connected. Note that when the first replica word line rplwl[0] is at a low-level, the first replica bit-line rplbt[0] is pre-charged to the power supply voltage $V_{DD}$ of a high-level by the P-channel MOS transistor P0 serving as the first pre-charge transistor PCH0. Therefore, the second replica word line (rplwl[1]) of the output terminal of the first inverter (INV0) becomes a low-level in response to a high-level of the first replica bit-line rplbt[0]. As a result, the second replica bit-line (rplbt[1]) of a drain of the second pre-charge transistor PCH1 (P-channel MOS transistor P1) is at a high-level in response to a low-level of the second replica word line (rplwl[1]). Therefore, the inverted replica bit-line rplbtn of the output terminal of the second inverter (INV1) and the sense-amplifier enable signal sae of the output terminal of the buffer BUF become at low-levels in response to the high-level of the second replica bit-line (rplbt[1]).

In the meantime, the potential of the first replica word line rplwl[0] rises to a high-level in response to the rising of the clock signal CLK. Inside the plurality (the number of p, p>1) of first replica memory cells RPLCELL, the power supply voltage $V_{DD}$ of a high-level is supplied to an input terminal of a CMOS inverter constituted by a P-channel MOS transistor P11 and an N-channel MOS transistor N11, so that an output terminal of this CMOS inverter is maintained at a ground potential GND. By the rising of the potential of the first replica word line rplwl[0] to a high-level, N-channel MOS transistors N12 serving as transfer transistors inside the plurality (the number of p, p>1) of first replica memory cells RPLCELL are turned on, so that the pre-charged electric charges of the first replica bit-line rplbt[0] are discharged to the ground potential GND via the plurality (the number of p) of transfer transistors N12 inside the plurality (the number of p, p>1) of first replica memory cells RPLCELL. When the potential of the first replica bit-line rplbt[0] is lowered to a level which is lower than a logic threshold of the first inverter INV0 by this discharge, the second replica word line rplwl[1] of the output of the first inverter INV0 becomes at a high-level. Then, the N-channel MOS transistors N12 serving as the transfer transistors inside the plurality (the number of r, r>1) of second replica memory cells RPLCELL are turned on, so that the pre-charged electric charges of the second replica bit-line rplbt[1] are discharged to the ground potential GND via the plurality (the number of r) of transfer transistors N12 inside the plurality (the number of r, r>1) of second replica memory cells RPLCELL. When the potential of the second replica bit-line rplbt[1] is lowered to a level which is lower than a logic threshold of the second inverter INV1 by this discharge, the potential of the inverted replica bit-line rplbtn of the output of the second inverter INV1 rises. The signal of the inverted replica bit-line rplbtn is supplied to the input terminal of the buffer BUF, and the sense-amplifier enable signal sae generated from the output terminal of the buffer BUF is supplied to the plurality (m+1>1) of sense-amplifiers SA. The potential difference ΔV among the plurality (m+1>1) of bit-lines/inverted-bit-line pairs (bt[0], bb[0] to bt[m], bb[m]) at the rising timing of the sense-amplifier enable signal sae is amplified by the plurality (m+1>1) of sense-amplifiers SA, whereby read data q[0] to [m] are outputted. When the potential difference ΔV of this bit-line/inverted-bit-line pair is smaller than an offset portion of the inputted potential difference of the sense-amplifier SA, reading of data results in failure. Adjustment of the timing is executed so that a timing where the potential of any one selected from among the word lines wl[0] to [n] rises and the potential difference ΔV among the plurality (m+1>1) of bit-lines/inverted-bit-lines becomes larger than the offset portion of the input potential difference of the sense-amplifier SA is nearly simultaneous with a timing where the first and second replica word lines rplwl[0] and rplwl[1] rise and the first and second replica bit-lines rplbt[0] and rplbt[1] fall and the sense-amplifier enable signal sae rises. The adjustment of the rising timing of the potential of the sense-amplifier enable signal sae can be executed by adjusting the number (the number of p) of first replica memory cells RPLCELL connected to the first replica bit-line rplbt[0] and the number (the number of r) of second replica memory cells RPLCELL connected to the second replica bit-line rplbt[1].

In the SRAM according to the first embodiment of the present invention shown in FIG. 3, since the replica bit-line is divided into the plurality of replica bit-lines rplbt[0] and replbt[1], a delay amount of each of the divided replica bit-lines rplbt[0] and rplbt[1] is reduced. By the reduction of the delay amount of each of the divided replica bit-lines rplbt[0] and rplbt[1], the delay fluctuations of each of the divided replica bit-lines rplbt[0] and rplbt[1] are reduced. As a result, the fluctuations of the generating timing of the sense-amplifier enable signal (sae), due to the reduced delay fluctuations of each of the replica bit-lines rplbt[0] and rplbt[1] and the local fluctuations of the logic thresholds of the first and second inverters (INV0, INV1), can be reduced.

Figure 18:
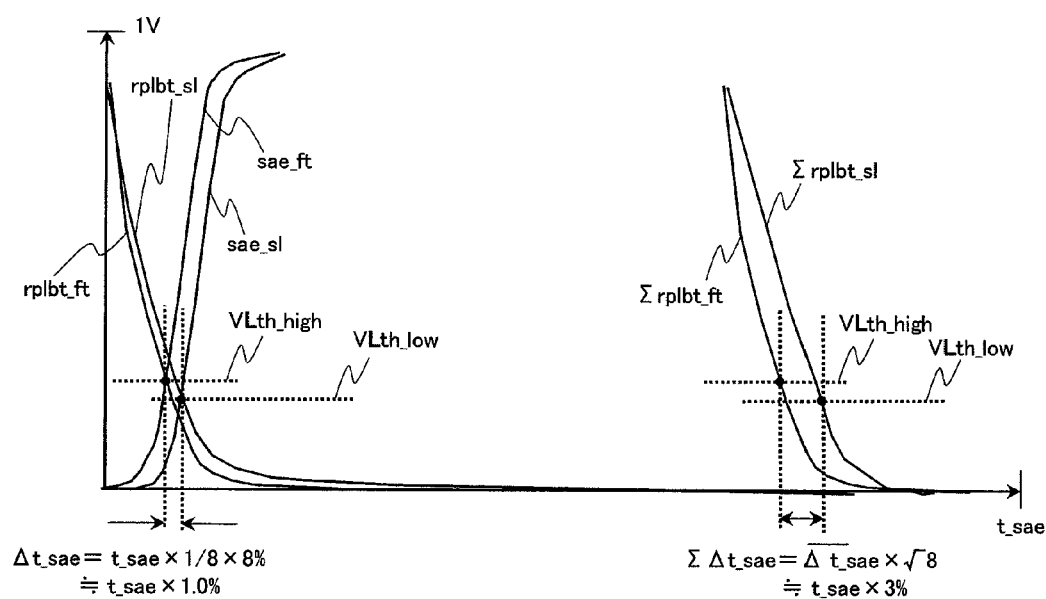
FIG. 18 is a view showing a fluctuation state of a generating timing of the sense-amplifier enable signal due to delay fluctuations of the replica bit-lines of the SRAM according to the first embodiment of the present invention described in FIGS. 3 and 4, and due to the local fluctuations of the logic threshold of the inverter.

FIG. 18 is a view showing a fluctuation state of a generating timing (rising timing) of the sense-amplifier enable signal sae due to the delay fluctuations of the replica bit-line of the SRAM according to the first embodiment of the present invention shown in FIGS. 3 and 4, and due to the local fluctuations of the logic threshold of the inverter.

In an example of FIG. 18, the number of word lines (wl[0] to [n]) of the SRAM is 1024 and, specifically, the replica bit-line is divided into 8 (eight) replica bit-lines rplbt. Therefore, a load capacity and the delay amount of each of the divided replica bit-lines rplbt are remarkably reduced. That is, as compared with FIG. 17, the delay amount of each of the eight-divided replica bit-lines rplbt as shown on left-side of FIG. 18 is reduced approximately to ⅛ (one eighth) where the replica bit-line is divided into eight. At this time, even when the replica bit-line is divided into eight as shown on the left-side of FIG. 18 similarly to FIG. 17, there are the case where the delay of the replica bit-line rplbt is small to have a high-speed transient-amplitude characteristic rplbt_ft and the case where the delay of the replica bit-line rplbt is large to have a low-speed transient-amplitude characteristic rplbt_sl. In the meantime, there are the case where the logic threshold of the inverter INV, to which the signal of each of the eight-divided replica bit-lines rplbt is supplied, has a high logic threshold voltage $V_L$th_high, and the case where the logic threshold of the inverter INV has a low logic threshold voltage $V_L$th_low. By a crossover of the high-speed transient-amplitude characteristic replbt_ft and the low logic threshold voltage $V_L$th_low, the generating timing of the small delay sae_ft of the sense-amplifier enable signal sae is determined, and by a crossover of the low-speed transient-amplitude characteristic rplbt_sl and the high logic threshold voltage $V_L$th_high, the generating timing of the large delay sae_sl of the sense-amplifier enable signal sae is determined. However, the delay fluctuations of each of the eight-divided replica bit-lines as shown in the left-side of FIG. 18, and a fluctuation width Δt_sae of the generating timing of the sense-amplifier enable signal sae due to the fluctuations of the logic threshold voltage of the inverter INV are reduced approximately to ⅛ (one eighth) as compared with FIG. 17. Specifically, when the replica bit-line is divided into eight as shown in the left-side of FIG. 18, a fluctuation width Δt_sae of the generating timing of the sense-amplifier enable signal sae is reduced to an extremely small value as follows:

$$\Delta t\_sae = t\_sae \times \tfrac{1}{8} \times 8\% \approx t\_sae \times 1\%.$$

Specifically, by connecting in series each of the eight-divided replica bit-lines rplbt and each of inverters INV, a total fluctuation width ΣΔt_sae of the generating timings of the sense-amplifier enable signals sae of the SRAM according to the first embodiment shown in FIG. 3 is determined. Within a range from the fluctuation width Δt_sae of the first generating timing by a first serial connection of the first replica bit-line rplbt and the first inverter INV to the fluctuation width Δt_sae of the eighth generating timing by an eighth serial connection of the eighth replica bit-line rplbt and the eighth inverter INV, respective fluctuation widths Δt_sae are approximately normally-distributed from a positive fluctuation value to a negative fluctuation value. That is, the total fluctuation width ΣΔt_sae of the generating timings in the above-mentioned eight-divided case is as follows:

$$\Sigma\Delta t\_sae = \Delta t\_sae \times \sqrt{8} \approx t\_sae \times 3\%.$$

Figure 17:
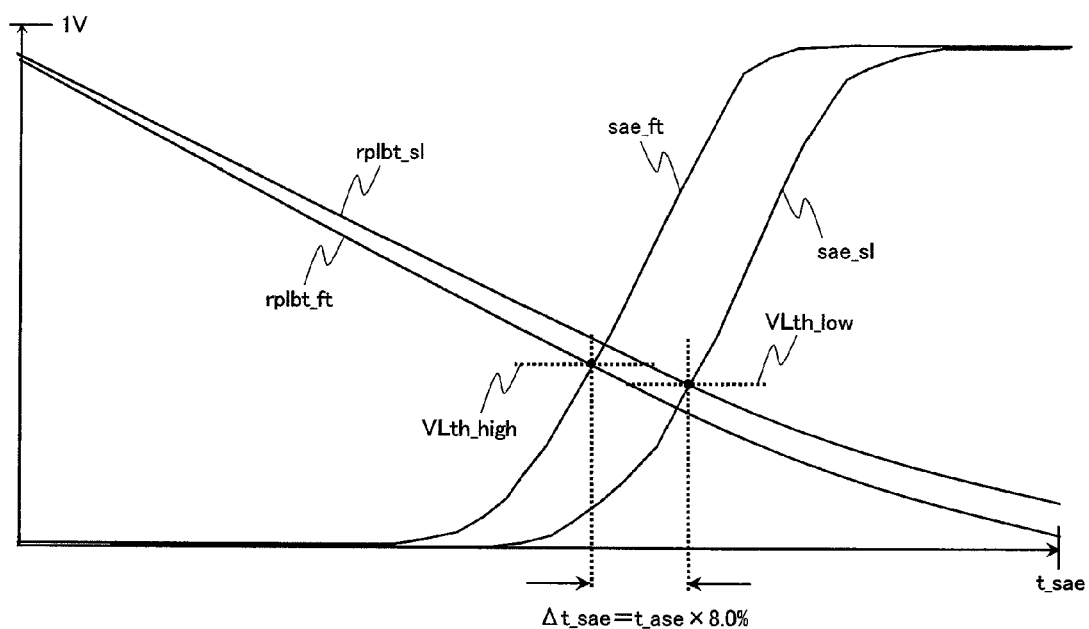
FIG. 17 is a view showing a fluctuation state of a generating timing of a sense-amplifier enable signal due to delay fluctuations of replica bit-lines of a SRAM that uses the replica bit-lines studied by the present inventors prior to the present invention described in FIGS. 1 and 2, and due to local fluctuations of a logic threshold of an inverter.

The t_sae×3% of the total fluctuation width ΣΔt_sae of the generating timings of the sense-amplifier enable signal sae shown on the left-side of FIG. 18 in the SRAM where the replica bit-line (RBL) of the first embodiment shown in FIG. 3 is divided into eight can be reduced to half or less of t_sae×8% of the fluctuation width Δt_sae of the generating timing of FIG. 17 in the SRAM studied by the present inventors based on the technique of FIG. 1 prior to the present invention.

Second Embodiment

A second embodiment of the present invention relates to layout of the inverters INV0 and INV1 and layout of the replica bit-line pre-charge transistors PCH0 and PCH1 in the SRAM of FIG. 3 according to the first embodiment of the present invention.

Figure 5:
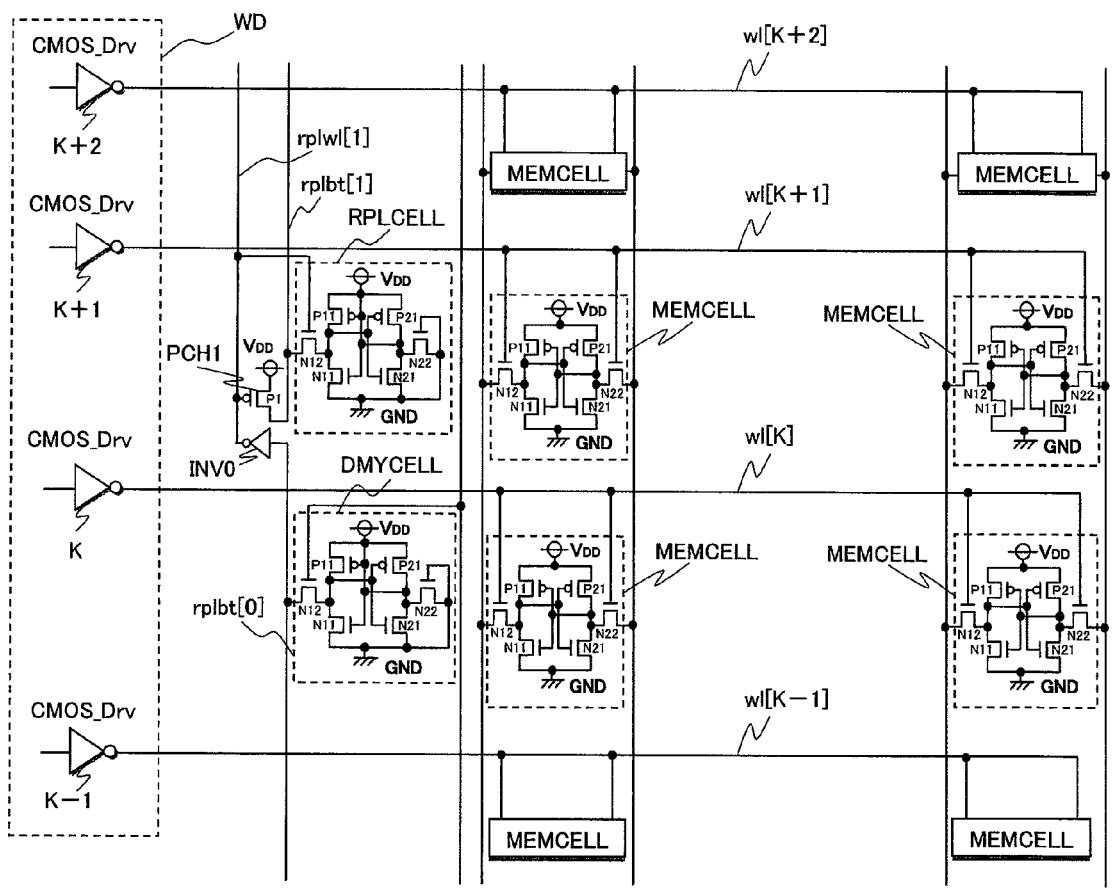
FIG. 5 is a view showing a configuration of a SRAM according to a second embodiment of the present invention.

FIG. 5 is a view showing a configuration of a SRAM according to a second embodiment of the present invention.

Shown in FIG. 5 is, in detail, an internal configuration of the word driver (WD) of the SRAM according to the first embodiment shown in FIG. 3. The word driver (WD) includes a plurality of CMOS word drivers, . . . , (K−1, CMOS_Drv), (K, CMOS_Drv), (K+1, CMOS_Drv), (K+2, CMOS_Drv), . . . ; an output terminal of the CMOS word driver (K−1, CMOS_Drv) is connected to a word line wl[K−1]; an output terminal of the CMOS word driver (K, CMOS_Drv) is connected to a word line wl[K]; an output terminal of the CMOS word driver (K+1, CMOS_Drv) is connected to a word line wl[K+1]; and an output terminal of the CMOS word driver (K+2, CMOS_Drv) is connected to a word line wl[K+2]. Connected to a plurality of word lines wl[K−1], wl[k], wl[K+1], and wl[K+2] are a plurality of SRAM memory cells (MEMCELL). A first replica bit-line (rplbt[0]), to which a first dummy memory cell (DMYCELL) is connected, is connected to an input terminal of the first inverter INV0, and an output terminal of this first inverter INV0 is connected to a second replica word line (rplwl[1]) to which a second pre-charge transistor PCH1 and a second replica memory cell (RPLCELL) are connected.

Figure 6:
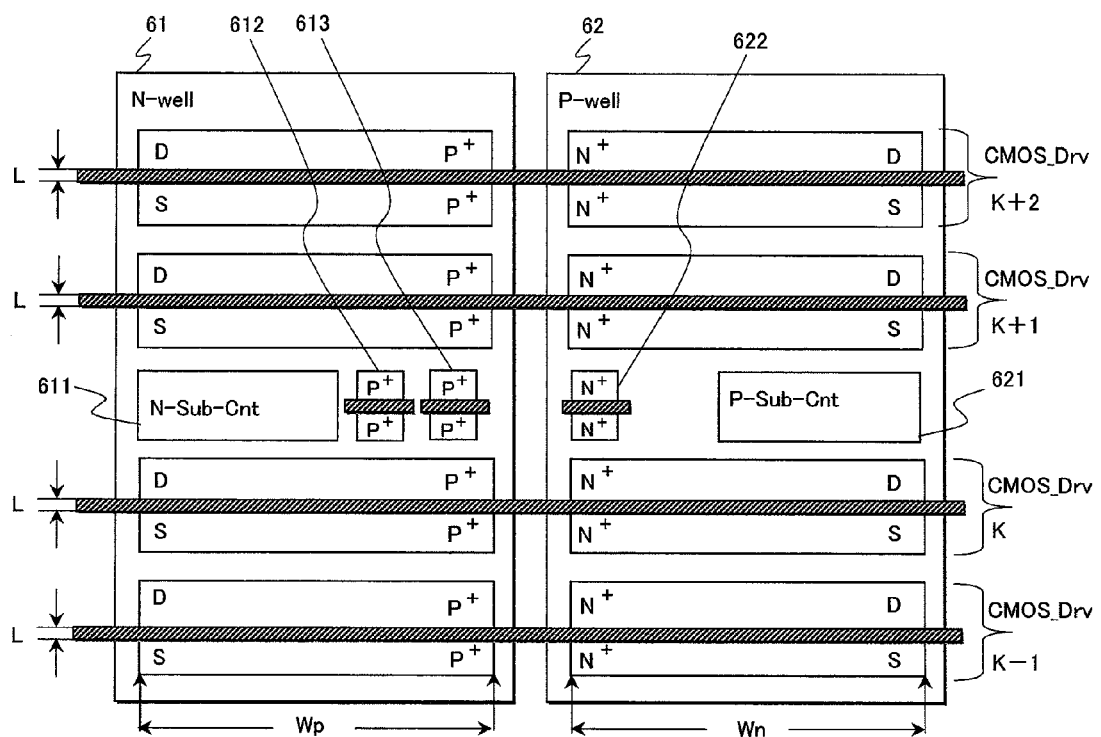
FIG. 6 is a view showing plan layout of a device in forming, on a chip of a semiconductor integrated circuit, the SRAM according to the second embodiment of the present invention illustrated in FIG. 5.

FIG. 6 is a view showing plan layout of a device in forming, on a chip of a semiconductor integrated circuit, the SRAM according to the second embodiment shown in FIG. 5.

Shown in FIG. 6 are an N-well region 61 and a P-well region 62 for the CMOS device.

Formed in the N-well region 61 are four P-channel MOS transistors of four CMOS word drivers (K−1, CMOS_Drv), (K, CMOS_Drv), (K+1, CMOS_Drv), and (K+2, CMOS_Drv). These four P-channel MOS transistors each include a gate electrode with a channel length L, and source-drain impurity regions (S, D) each having a channel width Wp, and an N-well substrate power-supply contact region 611 is formed between the second and third P-channel MOS transistors that are formed in the N-well region 61. Supplied to this N-well substrate power-supply contact region 611 is a high-level voltage such as a power supply voltage $V_{DD}$ via a metal wiring. Two P-channel MOS transistors 612 and 613 are formed on right-side in the N-well substrate power-supply contact region 611, and the transistor 612 is used as a second pre-charge transistor PCH1 while the transistor 613 is used as a P-channel MOS transistor constituting the first inverter INV0. Note that a layout height of the N-well substrate power-supply contact region 611 is set to be approximately as high as a layout height of two P-channel MOS transistors 612 and 613. Further, a sum of layout widths of the N-well substrate power-supply contact region 611 and the two P-channel MOS transistors 612 and 613 is set to be approximately equal to a channel width Wp of the P-channel MOS transistor.

Formed in the P-well region 62 are four N-channel MOS transistors of four CMOS word drivers (K−1, CMOS_Drv), (K, CMOS_Drv), (K+1, CMOS_Drv), and (K+2, CMOS_Drv). These four N-channel MOS transistors each include a gate electrode with a channel length L, and source-drain impurity regions (S, D) each having a channel width Wn, and a P-well substrate power-supply contact region 621 is formed between the second and third N-channel MOS transistors formed in the P-well region 62. Supplied to this P-well substrate power-supply contact region 621 is a low-level voltage such as a ground potential GND via a metal wiring. One N-channel MOS transistor 622 is formed on left-side of the P-well substrate power-supply contact region 621, and this transistor 622 is used as an N-channel MOS transistor constituting the first inverter INV0. Note that a layout height of the P-well substrate power-supply contact region 621 is set to be approximately equal to a layout height of one N-channel MOS transistor 622. Further, a sum of layout widths of the P-well substrate power-supply contact region 621 and one N-channel MOS transistors 622 is set to be approximately equal to the channel width Wn of the N-channel MOS transistor.

Third Embodiment

A third embodiment of the present invention forms the inverters INV0 and INV1, and the pre-charge transistors PCH0 and PCH1 of the replica bit-lines rplbt[0] and [1], all of which are included in the SRAM of the first embodiment, by using the SRAM memory cells MEMCELL, the replica memory cells RPLCELL, and the dummy memory cells DMYCELL.

FIG. 7 is a view showing a configuration of a SRAM according to a third embodiment of the present invention.

The inverters INV0 and INV1 included in the SRAM of the first embodiment shown in FIG. 3 are replaced by an inverter cell (INVCELL) 701 of the SRAM of the third embodiment shown in FIG. 7; and the pre-charge transistors PCH0 and PCH1 included in the SRAM of the first embodiment shown in FIG. 3 are replaced by a pre-charge cell (PCHCELL) 702 of the SRAM of the third embodiment shown in FIG. 7. Note that the SRAM of the third embodiment shown in FIG. 7 includes a dummy memory cell (DMYCELL) 703, and a replica memory cell (RPLCELL) 704 similarly to the SRAM of the first embodiment shown in FIG. 3.

FIG. 8 is a view showing a configuration of an inverter cell (INVCELL) 701 of the SRAM according to the third embodiment shown in FIG. 7.

The inverter cell (INVCELL) 701 shown in FIG. 8 includes two P-channel MOS transistors pl180 and plr80 and four N-channel MOS transistors npl80, ndl80, ndr80, and npr80, similarly to the SRAM memory cell (MEMCELL), the replica memory cell (RPLCELL), and the dummy memory cell (DMYCELL) included in the SRAM of the first embodiment shown in FIG. 3. In the inverter cell (INVCELL) 701 shown in FIG. 8, an input signal of the replica bit-line rplbt[0] is inverted by the CMOS inverter constituted by the P-channel MOS transistor npr80 and the N-channel MOS transistor ndr80, and generates the replica word line signal rplwl[1]. Note that drive capacity of the inverter cell (INVCELL) 701 shown in FIG. 8 can be adjusted by the number of memory cells connected in parallel.

FIG. 9 is a view showing a configuration of the pre-charge cell (PCHCELL) 702 of the SRAM according to the third embodiment shown in FIG. 7.

The pre-charge cell (PCHCELL) 702 shown in FIG. 9 includes two P-channel MOS transistors pll90 and plr90 and four N-channel MOS transistors npl90, ndl90, ndr90, and npr90, similarly to the SRAM memory cell (MEMCELL), the replica memory cell (RPLCELL), and the dummy memory cell (DMYCELL) included in the SRAM of the first embodiment shown in FIG. 3. In the pre-charge cell (PCHCELL) 702 shown in FIG. 9, the replica word line signal rplwl[0] as an input signal is supplied to a gate of the P-channel MOS transistor pll90, whereby an output signal of the replica bit-line rplbt[0] is generated from a drain of the transistor pll90. When the replica word line signal rplwl[0] is at a low-level, the P-channel MOS transistor pll90 is turned on, so that the potential of the replica bit-line rplbt[0] is pre-charged up to a high-level of the power supply voltage $V_{DD}$. When the replica word line signal rplwl[0] is at a high-level, the P-channel MOS transistor pll90 is turned off, so that the replica bit-line rplbt[0] is discharged to the ground potential GND by the replica memory cell (RPLCELL). Further, pre-charge drive capacity of the pre-charge cell (PCHCELL) 702 shown in FIG. 9 can be also adjusted by the number of memory cells connected in parallel.

Fourth Embodiment

A fourth embodiment of the present invention adjusts a load capacity of each of the replica bit-lines rplbt[0] and [1] by changing a connection state of a transistor node of the dummy memory cell (DMYCELL) 703 included in the SRAM of the third embodiment shown in FIG. 7.

Figure 10:
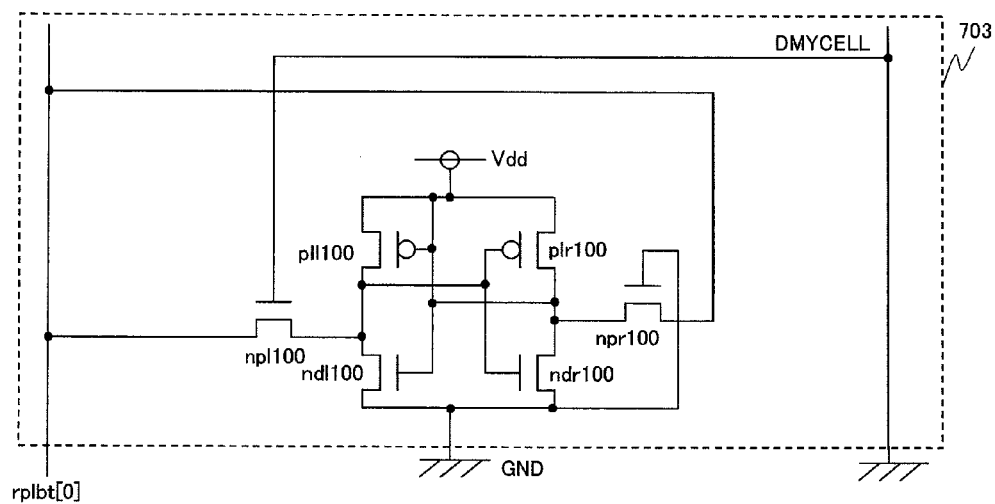
FIG. 10 is a view showing a configuration of a dummy memory cell included in a SRAM according to a fourth embodiment of the present invention.

FIG. 10 is a view showing a configuration of a dummy memory cell (DMYCELL) 703 included in a SRAM according to a fourth embodiment of the present invention.

The dummy memory cell (DMYCELL) 703 shown in FIG. 10 includes two P-channel MOS transistors pll100 and plr100 and four N-channel MOS transistors npl100, ndl100, ndr100, and npr100. In the dummy memory cell (DMYCELL) 703 shown in FIG. 10, a drain of the N-channel MOS transistor nprl100 in addition to the drain of the N-channel MOS transistor npll100 is connected to a replica bit-line rplbt[0], whereby load capacity of the replica bit-line rplbt[0] can be increased.

Figure 11:
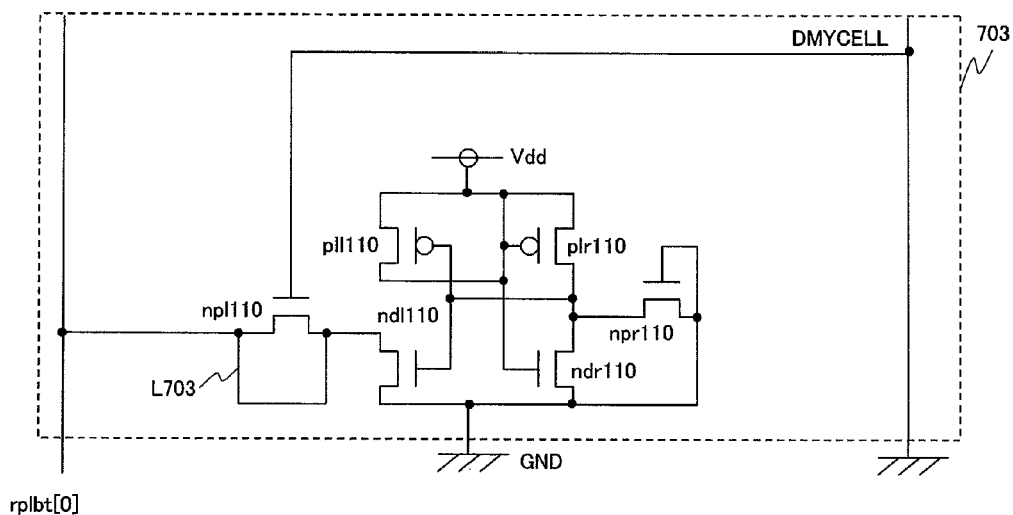
FIG. 11 is a view showing the configuration of the dummy memory cell included in the SRAM according to the fourth embodiment of the present invention.

FIG. 11 is also a view showing the configuration of the dummy memory cell (DMYCELL) 703 included in the SRAM according to the fourth embodiment of the present invention.

The dummy memory cell (DMYCELL) 703 shown in FIG. 11 includes two P-channel MOS transistors pll110 and plr110 and four N-channel MOS transistors npl110, ndl110, ndr110, and npr110. In the dummy memory cell (DMYCELL) 703 shown in FIG. 11, a drain and a source of the N-channel MOS transistor npl110 are commonly connected to the replica bit-line rplbt[0] by an internal wiring L703 of the cell, whereby the load capacity of the replica bit-line rplbt[0] can be increased.

Figure 12:
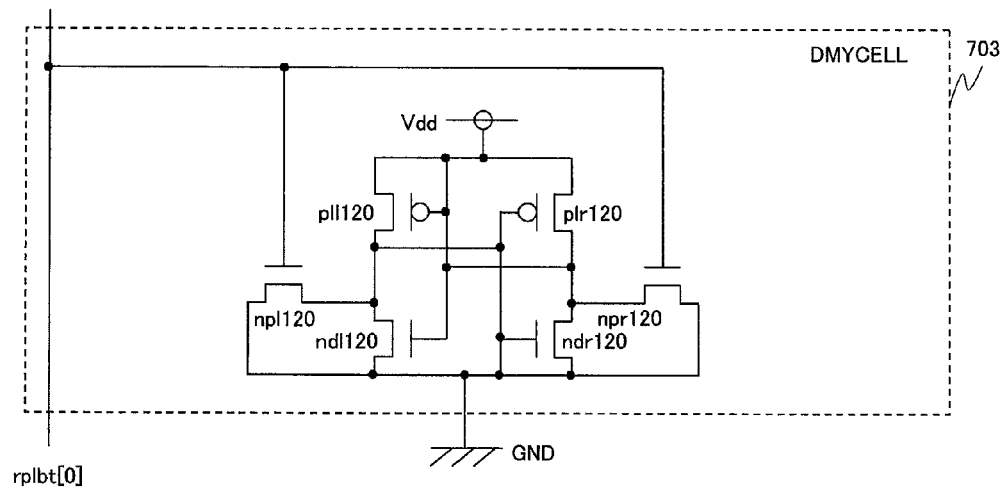
FIG. 12 is a view showing a configuration of a part of the dummy memory cell included in the SRAM according to the fourth embodiment of the present invention.

FIG. 12 is also a view showing the configuration of the dummy memory cell (DMYCELL) 703 included in the SRAM according to the fourth embodiment of the present invention.

The dummy memory cell (DMYCELL) 703 shown in FIG. 12 includes two P-channel MOS transistors pll120 and plr120 and four N-channel MOS transistors npl120, ndl120, ndr120, and npr120. In the dummy memory cell (DMYCELL) 703 shown in FIG. 12, each gate capacitance of two N-channel MOS transistors npl120 and npr120 is connected to the replica bit-line rplbt[0], whereby load capacity of the replica bit-line rplbt[0] can be increased.

Figure 13:
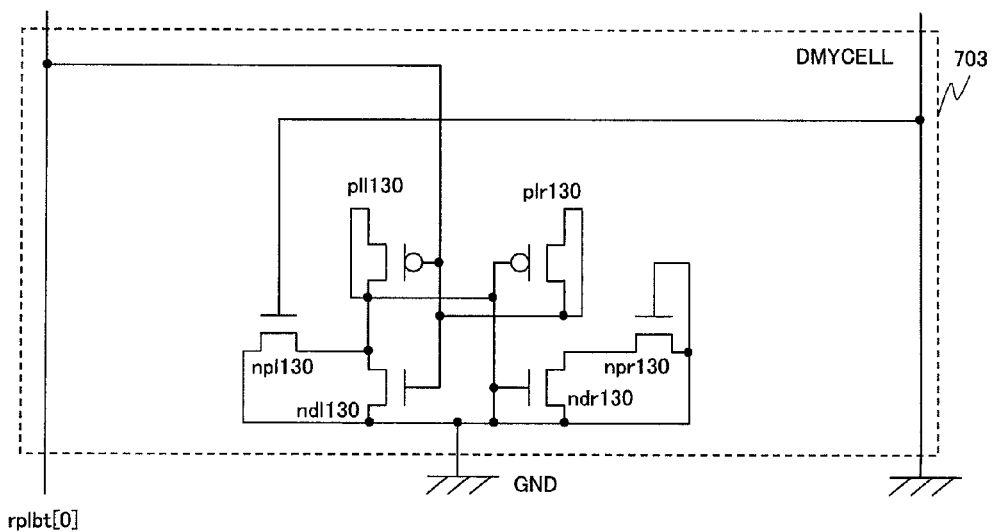
FIG. 13 is a top plan view of a silicon chip showing layout of various devices constituting a semiconductor integrated circuit according to one embodiment of the present invention shown in FIG. 12.

FIG. 13 is also a view showing the configuration of the dummy memory cell (DYMCELL) 703 included in the SRAM according to the fourth embodiment of the present invention.

The dummy memory cell (DMYCELL) 703 shown in FIG. 13 includes two P-channel MOS transistors pll150 and plr150 and four N-channel MOS transistors npl150, ndl150, ndr150, and npr150. In the dummy memory cell (DMYCELL) 703 shown in FIG. 13, gate capacitance of the P-channel MOS transistor pll150, gate capacitance of the N-channel MOS transistor ndl150, and source/drain capacitance of the P-channel MOS transistor plr150 are connected to the replica bit-line rplbt[0], whereby the load capacity of the replica bit-line rplbt[0] can be increased.

As described above, the configurations of the dummy memory cell (DMYCELL) 703 of FIGS. 10 to 13 can be also used by their mutual combination depending on the situation.

Fifth Embodiment

A fifth embodiment of the present invention allows an influence of a leak current of a dummy memory cell to be reflected to extraction a delay of a replica bit-line.

Figure 14:
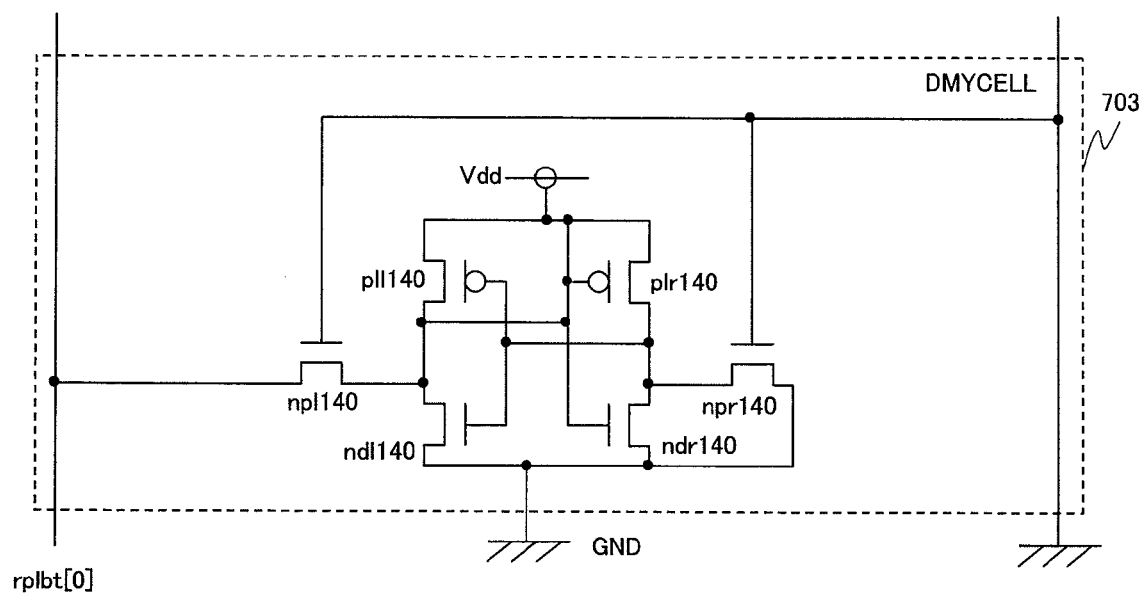
FIG. 14 is a view showing a configuration of a dummy memory cell included in a SRAM according to a fifth embodiment of the present invention.

FIG. 14 is a view showing a configuration of a part of a dummy memory cell (DMYCELL) 703 included in a SRAM according to a fifth embodiment of the present invention.

Inside each of the plurality of dummy memory cells (DMYCELL) included in the SRAM according to the first embodiment shown in FIG. 3, the power supply voltage $V_{DD}$ of a high-level is supplied to an input terminal of a CMOS inverter constituted by a P-channel MOS transistor P11 and an N-channel MOS transistor N11, and an output terminal of this CMOS inverter is maintained at the ground potential GND. Since an N-channel MOS transistor N12 serving as all transfer transistors of the dummy memory cells (DMYCELL) is turned off by the ground potential GND, the pre-charged electric charges of replica bit-lines rplbt[0] and rplbt[1] are discharged to the ground potential GND via a plurality of transfer transistors N12 that are inside the dummy memory cells (DMYCELL).

In contrast to this, inside a part of the dummy memory cell (DMYCELL) 703 included in the SRAM according to the fifth embodiment shown in FIG. 14, the power supply voltage $V_{DD}$ of a high-level is supplied to an input terminal of the other CMOS inverter constituted by the other P-channel MOS transistor plr140 and the other N-channel MOS transistor ndr140, and the output terminal of the other of the CMOS inverter is maintained at the ground potential GND. Therefore, the ground potential GND is supplied to an input terminal of the one CMOS inverter constituted by the one P-channel MOS transistor pll140 and the one N-channel MOS transistor ndl140, and an output terminal of this CMOS inverter is maintained at the power supply voltage $V_{DD}$ of a high-level. As a result, inside the part of the dummy memory cell (DMYCELL) 703 shown in FIG. 14, the replica bit-lines rplbt[0] and rplbt[1] are charged toward the power supply voltage $V_{DD}$ of the high-level by a leak current of the off-state transfer N-channel MOS transistor N12. Therefore, extraction delay amounts of the replica bit-lines rplbt[0] and rplbt [1] can be adjusted by an ability difference between the discharges of the replica bit-lines rplbt[0] and rplbt[1] due to the other dummy memory cell (DMYCELL) and the charges of the replica bit-lines rplbt[0] and rplbt[1] due to a part of the dummy memory cell (DEMYCELL) 703.

Sixth Embodiment

A sixth embodiment of the present invention relates to a system LSI of a system-on-chip (SoC) including, as a built-in memory, the SRAMs of the first to fifth embodiments shown in FIGS. 3 to 14.

Figure 15:
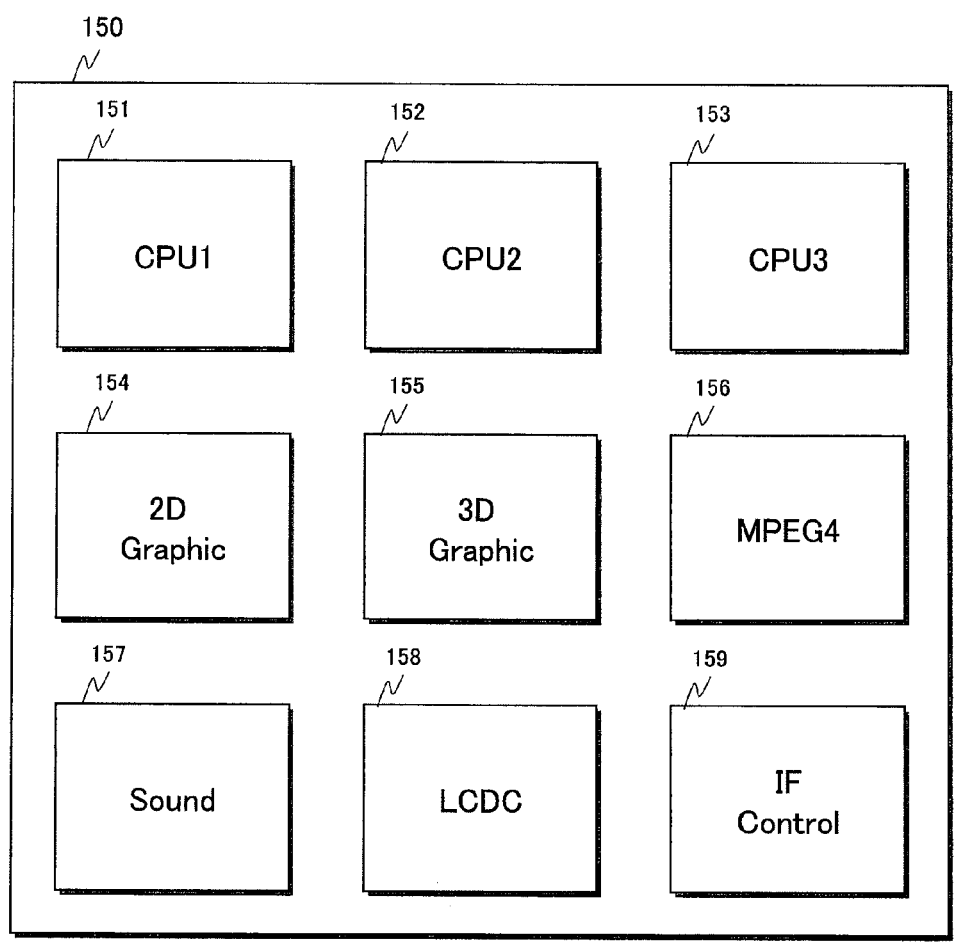
FIG. 15 is a view showing a configuration of a system LSI according to a sixth embodiment of the present invention.

FIG. 15 is a view showing a configuration of a system LSI according to a sixth embodiment of the present invention.

A semiconductor chip 150 of a system LSI on a system-on-chip (SoC) shown in FIG. 15 includes central process units (CPU) 151, 152, and 153 as intellectual property right (IP) cores, a two-dimensional image signal processing engine 154, a three-dimensional image signal processing engine 155, an moving image processing engine 156, an audio signal processing unit 157, a liquid crystal display controller 158, and an interface controller 159.

Included inside each of the IP cores 151 to 159 integrated on the semiconductor chip 150 shown in FIG. 15 is a built-in SRAM. Each of the IP cores 151 to 159 has a variety of memory capacitances for the built-in SRAM according to its function and performance. At this time, a built-in SRAM having an extremely large memory capacitance can be adopted as the SRAMs of the first to fifth embodiments shown in FIGS. 3 to 14. Moreover, the semiconductor chip 150 shown in FIG. 15 can also include a shared built-in SRAM having a large capacitance used in common by the plurality of IP cores 151 to 159. A design approach of a compiled RAM (CRAM) can be used for design of these built-in SRAMs each having a large capacitance and of the built-in SRAMs having various memory capacitances.

Figure 16:
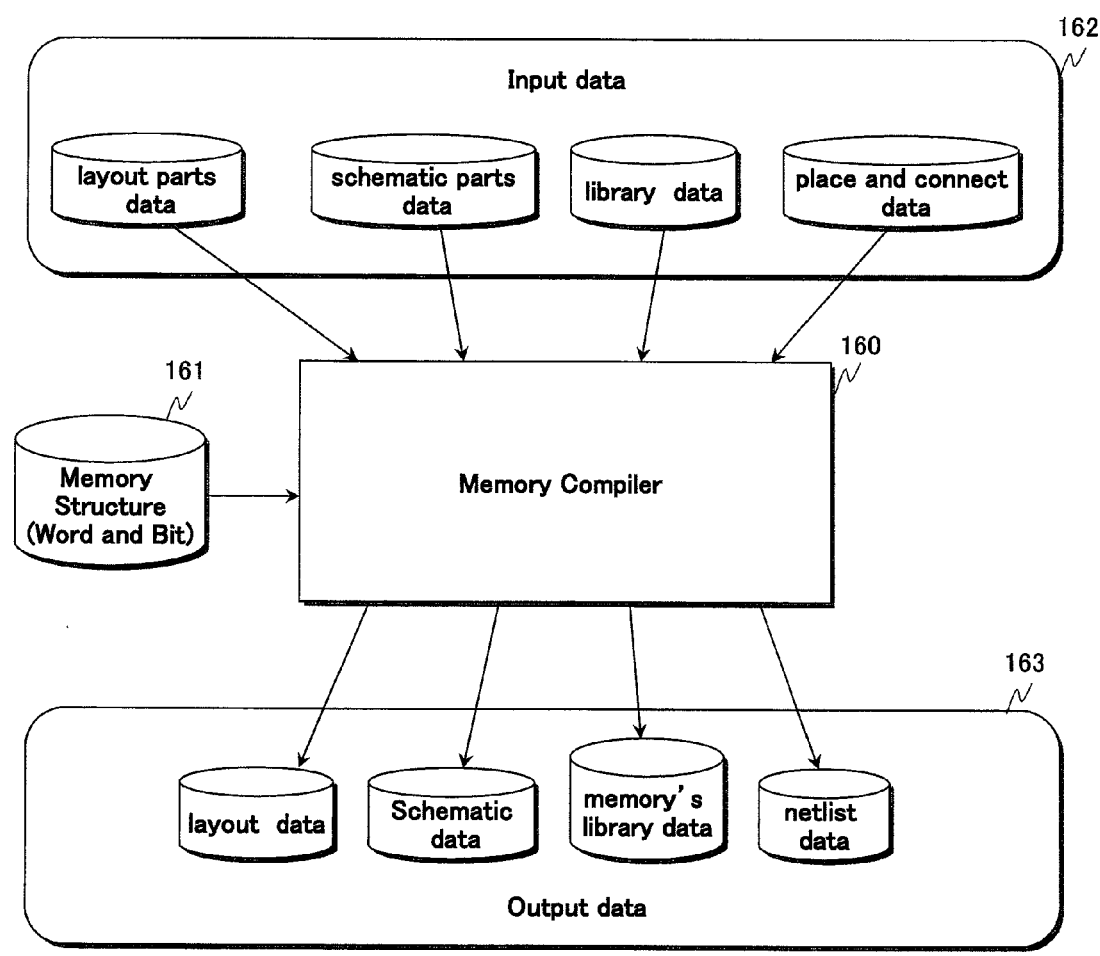
FIG. 16 is a view for describing a design approach of a compiled RAM used for design of a built-in SRAM stored in a semiconductor chip 150 of the system LSI according to the sixth embodiment of the present invention.

FIG. 16 is a view for describing the design approach of the compiled RAM (CRAM) used for the design of the built-in SRAM stored in the semiconductor chip 150 of the system LSI according to the sixth embodiment of the present invention.

The memory compiler 160 is a design tool located on an electronic computer such as an engineering work station, and electronic data 161 with a basic memory device structure of the built-in SRAM and input data 162 for the built-in SRAM having various memory capacitances are supplied to the memory compiler 160. The input data 162 includes layout component data with various built-in SRAMs, circuit component data, library data, and layout connection data.

The memory compiler 160 generates output data 163 of the automatically designed built-in SRAM from the supplied electronic data 161 having a memory device structure and from the input data 162 for the built-in SRAM. This output data 163 includes layout data, circuit data, memory library data, and net-list data.

Particularly, the memory compiler 160 of the design approach of the complied RAM of the sixth embodiment shown in FIG. 16 is configured to output suitable generation timings of the sense-amplifier enable signals by the automatically designed built-in SRAMs having various memory capacitances.

That is, the output data 163 automatically generated from the memory compiler 160 includes information that determines the generating timings of the sense-amplifier enable signals such as the number of divided replica bit-lines, the number of replica memory cells connected to each of the divided replica bit-lines, and the number of dummy memory cells.

The present invention made by the present inventors has been described specifically based on the embodiments. However, needless to say, the present invention is not limited to these embodiments, and may be variously modified within a scope of not departing from the gist of the invention.

For example, the built-in memory stored in the semiconductor integrated circuit device according to the embodiments of the present invention is not limited to the SRAM, and can be applied to a non-volatile memory such as a Dynamic Random Access Memory (DRAM), Electrically Erasable and Programmable Read Only Memory (EEPROM), or batch erasable flash memory.

Further, the present invention can be applied to a semiconductor memory integrated circuit device having a dedicated function of only a semiconductor memory that includes a non-volatile memory such as DRAM, EEPROM, or flash memory in addition to a system LSI called a system-on-chip (ScO).

What is claimed is:

1. A semiconductor integrated circuit device comprising:
a plurality of word lines disposed approximately in parallel to a column direction;
a plurality of bit-lines disposed approximately in parallel to a row direction;
a plurality of ordinary memory cells connected to the plurality of word lines and the plurality of bit-lines;
an access control circuit capable of selecting arbitrarily one word line from among the plurality of word lines in response to an address signal; and
a plurality of sense-amplifiers connected to the plurality of bit-lines,
wherein the semiconductor integrated circuit device further comprises a first replica bit-line, a second replica bit-line, a first replica memory cell, a second replica memory cell, a first logic circuit, and a second logic circuit,
the first replica memory cell is connected to the first replica bit-line, and the second replica memory cell is connected to the second replica bit-line,
an input terminal of the first logic circuit is connected to the first replica bit-line, and an output terminal of the first logic circuit is connected to the second replica bit-line,
an input terminal of the second logic circuit is connected to the second replica bit-line, and a sense-amplifier enable signal is generated from an output terminal of the second logic circuit, and
the sense-amplifier enable signal is supplied to the plurality of sense-amplifiers, whereby a plurality of read signals of the plurality of bit-lines are amplified by the plurality of sense-amplifiers, and a plurality of pieces of read data are generated from a plurality of output terminals of the plurality of sense-amplifiers.

2. The semiconductor integrated circuit device according to claim 1, further comprising a first pre-charge transistor and a second pre-charge transistor,
wherein the first pre-charge transistor is connected to the first replica bit-line, and the second pre-charge transistor is connected to the second replica bit-line, and
before the plurality of pieces of read data are generated from the plurality of output terminals of the plurality of sense-amplifiers in response to the sense-amplifier enable signal, the first pre-charge transistor and the second pre-charge transistor set the first replica bit-line and the second replica bit-line to predetermined pre-charge potentials, respectively.

3. The semiconductor integrated circuit device according to claim 2, further comprising a first dummy memory cell and a second dummy memory cell,
wherein the first dummy memory cell is connected to the first replica bit-line, and the second dummy memory cell is connected to the second replica bit-line.

4. The semiconductor integrated circuit device according to claim 3,
wherein a word driver included in the access control circuit includes a plurality of CMOS word drivers,
the plurality of CMOS word drivers are disposed in the row direction, and two CMOS word drivers, which are close to each other among the plurality of CMOS word drivers, include an intermediate region therebetween, and
the first pre-charge transistor and the first logic circuit are formed inside the intermediate region.

5. The semiconductor integrated circuit device according to claim 3,
wherein the first logic circuit is formed by a first CMOS memory cell, and the first pre-charge transistor is formed by a second CMOS memory cell.

6. The semiconductor integrated circuit device according to claim 5,
wherein the first CMOS memory cell forming the first logic circuit, and the second CMOS memory cell forming the first pre-charge transistor are formed between the first dummy memory cell connected to the first replica bit-line and the second replica memory cell connected to the second replica bit-line.

7. The semiconductor integrated circuit device according to claim 6,
wherein the first dummy memory cell connected to the first replica bit-line is formed by a third CMOS memory cell, and the second dummy memory cell connected to the second replica bit-line is formed by a fourth CMOS memory cell.

8. The semiconductor integrated circuit device according to claim 4,
wherein the plurality of ordinary memory cells are SRAM memory cells.

9. An operating method of a semiconductor integrated circuit device including:
a plurality of word lines disposed approximately in parallel to a column direction;
a plurality of bit-lines disposed approximately in parallel to a row direction;
a plurality of ordinary memory cells connected to the plurality of word lines and the plurality of bit-lines;
an access control circuit capable of selecting arbitrarily one word line from among the plurality of word lines in response to an address signal;
a plurality of sense-amplifiers connected to the plurality of bit-lines; and
a first replica bit-line, a second replica bit-line, a first replica memory cell, a second replica memory cell, a first logic circuit, and a second logic circuit,
wherein the first replica memory cell is connected to the first replica bit-line, and the second replica memory cell is connected to the second replica bit-line,
an input terminal of the first logic circuit is connected to the first replica bit-line, and an output terminal of the first logic circuit is connected to the second replica bit-line, and
an input terminal of the second logic circuit is connected to the second replica bit-line,
the operating method comprising the steps of:
generating a sense-amplifier enable signal from an output terminal of the second logic circuit; and
supplying the sense-amplifier enable signal to the plurality of sense-amplifiers.

10. The operating method of a semiconductor integrated circuit device according to claim 9, further comprising a first pre-charge transistor and a second pre-charge transistor,
wherein the first pre-charge transistor is connected to the first replica bit-line, and the second pre-charge transistor is connected to the second replica bit-line, and
before the plurality of pieces of read data are generated from the plurality of output terminals of the plurality of sense-amplifiers in response to the sense-amplifier enable signal, the first pre-charge transistor and the second pre-charge transistor set the first replica bit-line and the second replica bit-line to predetermined pre-charge potentials, respectively.

11. The operating method of a semiconductor integrated circuit device according to claim 10, further comprising a first dummy memory cell and a second dummy memory cell,
wherein the first dummy memory cell is connected to the first replica bit-line, and the second dummy memory cell is connected to the second replica bit-line.

12. The operating method of a semiconductor integrated circuit device according to claim 11,
wherein a word driver included in the access control circuit includes a plurality of CMOS word drivers,
the plurality of CMOS word drivers are disposed in the row direction, and two CMOS word drivers, which are close to each other among the plurality of CMOS word drivers, include an intermediate region therebetween, and
the first pre-charge transistor and the first logic circuit are formed inside the intermediate region.

13. The operating method of a semiconductor integrated circuit device according to claim 11,
wherein the first logic circuit is formed by a first CMOS memory cell, and the first pre-charge transistor is formed by a second CMOS memory cell.

14. The operating method of a semiconductor integrated circuit device according to claim 13,
wherein the first CMOS memory cell forming the first logic circuit, and the second CMOS memory cell forming the first pre-charge transistor are formed between the first dummy memory cell connected to the first replica bit-line and the second replica memory cell connected to the second replica bit-line.

15. The operating method of a semiconductor integrated circuit device according to claim 14,
wherein the first dummy memory cell connected to the first replica bit-line is formed by a third CMOS memory cell, and
the second dummy memory cell connected to the second replica bit-line is formed by a fourth CMOS memory cell.

16. The operating method of a semiconductor integrated circuit device according to claim 12,
wherein the plurality of ordinary memory cells are SRAM memory cells.

* * * * *